United States Patent
Lai et al.

(10) Patent No.: US 11,645,443 B2
(45) Date of Patent: May 9, 2023

(54) METHOD OF MODELING A MASK BY TAKING INTO ACCOUNT OF MASK PATTERN EDGE INTERACTION

(71) Applicant: Taiwan Semiconductor Manufacturing Co., Ltd., Hsin-Chu (TW)

(72) Inventors: Chien-Jen Lai, Hsinchu (TW); Xin Zhou, Hsinchu (TW); Danping Peng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 68 days.

(21) Appl. No.: 16/889,537

(22) Filed: Jun. 1, 2020

(65) Prior Publication Data

US 2020/0293709 A1 Sep. 17, 2020

Related U.S. Application Data

(63) Continuation of application No. 15/591,291, filed on May 10, 2017, now Pat. No. 10,671,786.

(60) Provisional application No. 62/427,308, filed on Nov. 29, 2016.

(51) Int. Cl.
*G06F 30/367* (2020.01)
*G03F 7/20* (2006.01)
*G03F 1/36* (2012.01)

(52) U.S. Cl.
CPC ............ *G06F 30/367* (2020.01); *G03F 1/36* (2013.01); *G03F 7/705* (2013.01); *G03F 7/70283* (2013.01); *G03F 7/70441* (2013.01)

(58) Field of Classification Search
CPC .... G03F 1/36; G03F 7/70283; G03F 7/70441; G03F 7/705; G06F 30/367
See application file for complete search history.

(56) References Cited

U.S. PATENT DOCUMENTS

| 6,738,859 | B2 | 5/2004 | Liebchen |
| 7,263,683 | B1* | 8/2007 | Capodieci ................. G03F 1/36 716/55 |
| 7,703,069 | B1* | 4/2010 | Liu ........................... G03F 1/36 716/50 |
| 8,640,060 | B2 | 1/2014 | Geshel |
| 8,762,900 | B2 | 6/2014 | Shin et al. |

(Continued)

OTHER PUBLICATIONS

Peng Liu, Zhengfan Zhang, Song Lan, Qian Zhao, Mu Feng, Hua-yu Liu, Venu Vellanki, and Yen-wen Lu "A full-chip 3D computational lithography framework", Proc. SPIE 8326, Optical Microlithography XXV, 83260A (Mar. 13, 2012).*

(Continued)

*Primary Examiner* — Mohammed S Rahaman
(74) *Attorney, Agent, or Firm* — Haynes and Boone, LLP

(57) ABSTRACT

A mask layout is received. An interaction-free mask model is applied to the mask layout. An edge interaction model is applied to the mask layout. The edge interaction model describes an influence due to a plurality of combinations of two or more edges interacting with one another. A thin mask model is applied to the mask layout. A near field is determined based on the applying of the interaction-free mask model, the applying of the edge interaction model, and the applying of the thin mask model.

20 Claims, 21 Drawing Sheets

(56) References Cited

U.S. PATENT DOCUMENTS

| | | |
|---|---|---|
| 8,764,995 B2 | 7/2014 | Chang et al. |
| 8,796,666 B1 | 8/2014 | Huang et al. |
| 8,812,999 B2 | 8/2014 | Liu et al. |
| 8,828,625 B2 | 9/2014 | Lu et al. |
| 8,841,047 B2 | 9/2014 | Yu et al. |
| 8,850,366 B2 | 9/2014 | Liu et al. |
| 8,877,409 B2 | 11/2014 | Hsu et al. |
| 8,906,595 B2 | 12/2014 | Liu et al. |
| 8,918,743 B1 * | 12/2014 | Yan ............... G03F 7/70283 716/51 |
| 8,954,899 B2 | 2/2015 | Wu et al. |
| 9,093,530 B2 | 4/2015 | Huang et al. |
| 9,184,054 B1 | 11/2015 | Huang et al. |
| 9,256,123 B2 | 2/2016 | Shih et al. |
| 9,367,655 B2 | 6/2016 | Shih et al. |
| 9,390,217 B2 | 7/2016 | Wang et al. |
| 9,529,268 B2 | 12/2016 | Chang et al. |
| 9,548,303 B2 | 1/2017 | Lee et al. |
| 2005/0191566 A1 * | 9/2005 | Liu ............... G06F 30/398 430/30 |
| 2005/0244728 A1 | 11/2005 | Liu et al. |
| 2006/0080634 A1 * | 4/2006 | Beale ............ G03F 7/70441 716/53 |
| 2007/0209029 A1 | 9/2007 | Ivonin et al. |
| 2008/0220376 A1 * | 9/2008 | Satake ........... G03F 7/70675 430/319 |
| 2008/0301621 A1 * | 12/2008 | Fukuhara ............ G03F 1/36 716/51 |
| 2010/0175042 A1 * | 7/2010 | Tirapu Azpiroz .. G03F 7/70441 716/55 |
| 2011/0022219 A1 * | 1/2011 | Saied ................ G03F 1/36 703/2 |
| 2011/0176719 A1 | 7/2011 | Inoue et al. |
| 2012/0252215 A1 * | 10/2012 | Abe ................. G03F 1/68 430/312 |
| 2012/0272196 A1 * | 10/2012 | Wong ................ G03F 1/36 716/53 |
| 2014/0189614 A1 | 7/2014 | Liu et al. |
| 2014/0282295 A1 | 9/2014 | Huang et al. |
| 2015/0213175 A1 * | 7/2015 | Arai ................. G03F 1/70 716/55 |
| 2015/0302132 A1 * | 10/2015 | Zhang ............. H01L 21/027 716/53 |
| 2016/0098511 A1 * | 4/2016 | Cecil ............ G03F 7/70441 716/51 |

OTHER PUBLICATIONS

Mask Edge Effects in Optical Lithography and Chip Level Modeling Methods Dissertation by Marshal Miller, University of California, Berkeley, Fall 2010.*

* cited by examiner

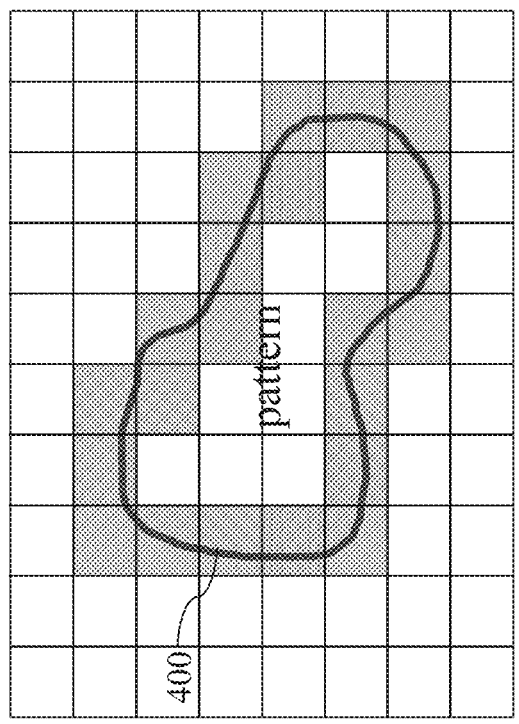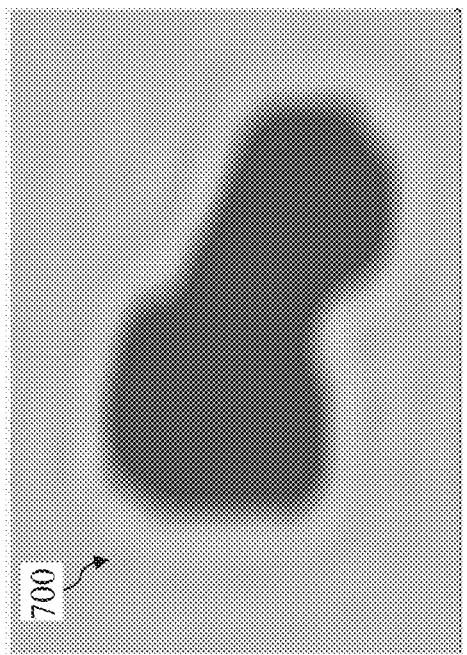
FIG. 10

How to Use $G_2$:
Compute the edge and orientation maps of the pattern

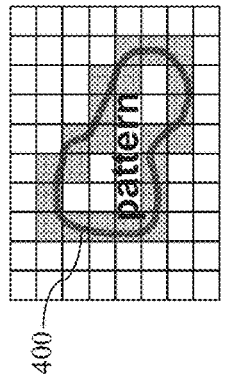

$|grad(x,y)|$ $\phi(x,y)$
orientation map

Compute the mask rotation components $Q_l$ for interested $l$'s.

$Q_l(x,y) =$ 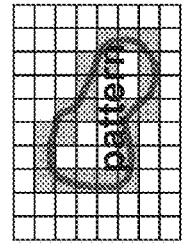 $\times exp[-i\, l\, \phi(x,y)]$

The 2E correction can be computed by $\Delta m_{2E}(r) = \sum_{l_1,l_2} \iint Q_{l_1}(r_1) Q_{l_2}(r_2) G_2^{(l_1,l_2)}(r-r_1, r-r_2) dr_1 dr_2$ 1. $r, r_1,$ and $r_2$ are 2D spatial position vectors.
2. Both $l_1$ and $l_2$ loop over all interested $l$'s.

FIG. 18

$$\Delta m_{2E}(r) = \sum_{l_1,l_2} \iint Q_{l_1}(r_1) Q_{l_2}(r_2) G_2^{(l_1 l_2)}(r-r_1, r-r_2) dr_1 dr_2$$

Computed from Step 1560 ← $\Delta m_{2E}(r)$

Computed with the result of Step 1570 → $G_2^{(l_1 l_2)}$

⇓ FFT $$\Delta \tilde{m}_{2E}(k) = \sum_{l_1,l_2} \sum_{k_1} \tilde{Q}_{l_1}(k_1) \tilde{Q}_{l_2}(k-k_1) \tilde{G}_2^{(l_1 l_2)}(k_1, k-k_1)$$

FIG. 20

METHOD OF MODELING A MASK BY TAKING INTO ACCOUNT OF MASK PATTERN EDGE INTERACTION

CROSS-REFERENCE TO RELATED APPLICATIONS

This application is a continuation of U.S. patent application Ser. No. 15/591,291, filed May 10, 2017, and entitled "Method of Modeling a Mask by Taking Into Account of Mask Pattern Edge Interaction", which claims priority to U.S. Provisional Patent Application Ser. No. 62/427,308, filed on Nov. 29, 2016, and entitled "Photolithography Mask Model Accuracy Improvement for Edge Interaction from Arbitrary Layouts," the disclosures of which are hereby incorporated herein by reference in their entirety.

BACKGROUND

The semiconductor device industry has experienced rapid growth. In the course of semiconductor device evolution, the functional density has generally increased while feature size has decreased. This scaling down process generally provides benefits by increasing production efficiency and lowering associated costs. Such scaling down has also increased the complexity of design and manufacturing these devices.

One technique applied to the design and manufacturing of semiconductor devices is optical proximity correction (OPC). OPC includes applying features that will alter the photomask design of the layout of the semiconductor device in order to compensate for distortions caused by diffraction of radiation and the chemical process of photo-resist that occur during the use of the lithography tools. Thus, OPC provides for producing circuit patterns on a substrate that more closely conform to a semiconductor device designer's (e.g., integrated circuit (IC) designer) layout for the device. OPC includes all resolution enhancement techniques performed with a reticle or photomask including, for example, adding sub-resolution features to the photomask that interact with the original patterns in the physical design, adding features to the original patterns such as "serifs," adding jogs to features in the original pattern, modifying main feature pattern shapes or edges, and other enhancements. As process nodes shrink, OPC processes and the resultant patterns become more complex.

One type of advanced OPC involves inverse lithography technology (ILT). ILT includes simulating the optical lithography process in the reverse direction, using the desired pattern on the substrate as an input to the simulations. The ILT process may produce complex, curvilinear patterns on a photomask or reticle, rather than the Manhattan patterns that are formed on conventional photomasks or reticles. Unfortunately, conventional ILT photomasks and the methods of fabrication thereof still face various difficulties with respect to the non-Manhattan patterns.

Therefore, although existing ILT photomasks have been generally adequate for their intended purposes, they have not been entirely satisfactory in all respects, in particular the missing of an accurate mask model capable of dealing with non-Manhattan patterns.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 illustrates the non-Manhattan mask pattern and an aerial image projected by the non-Manhattan pattern on a wafer according to various aspects of the present disclosure.

FIG. 18 is a graphical illustration of how to use the edge interaction kernels to perform an edge interaction correction process according to various aspects of the present disclosure.

FIG. 20 illustrates some mathematical relations among the edge interaction, the edge interaction kernels, and the mask pattern according to various aspects of the present disclosure.

DETAILED DESCRIPTION

Figure 1:
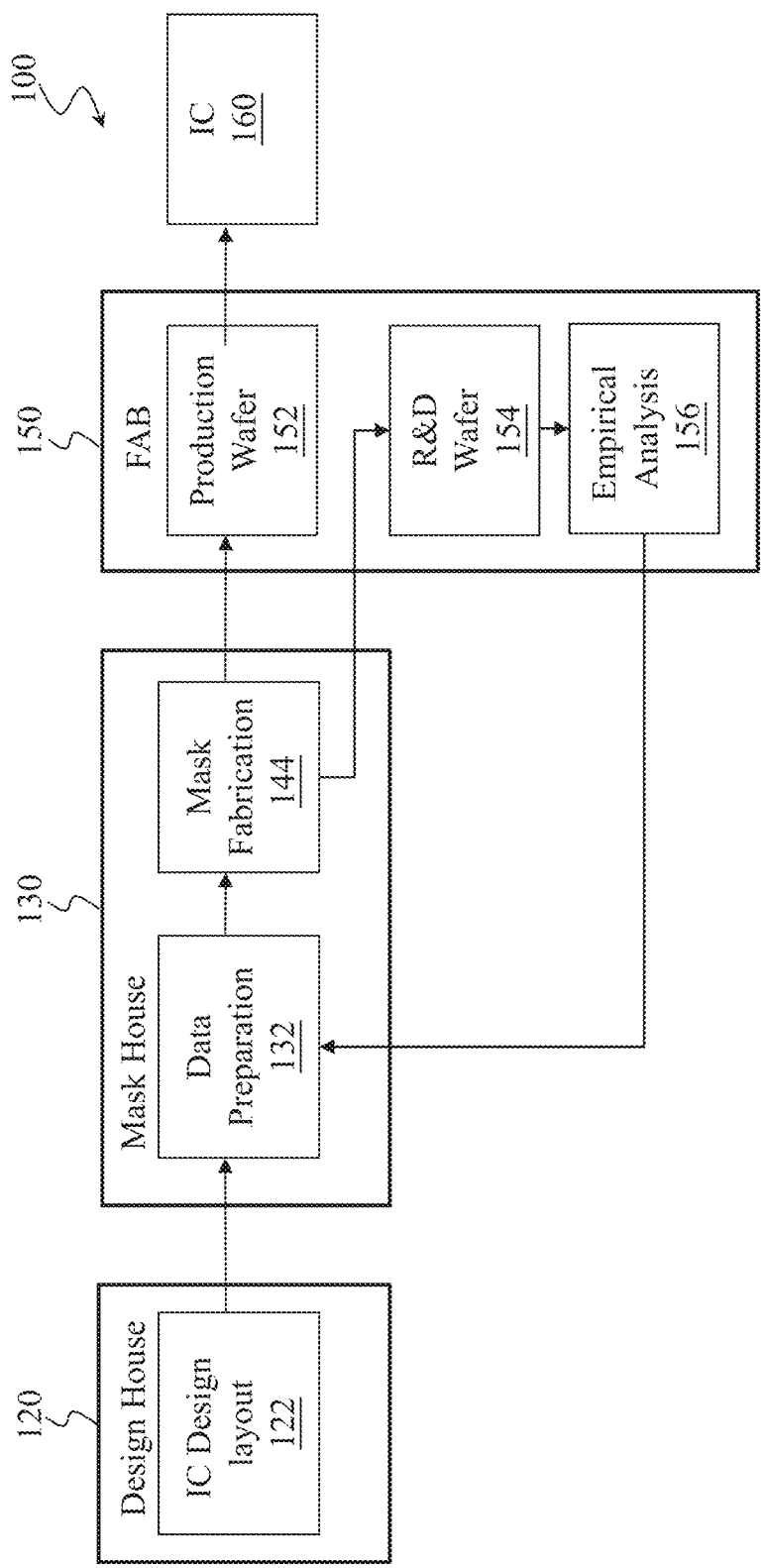
FIG. 1 is a simplified block diagram of an embodiment of an integrated circuit (IC) manufacturing system according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As semiconductor fabrication progresses to increasingly small technology nodes, various techniques are employed to help achieve the small device sizes. One example of such technique is inverse lithography technology (ILT). In more detail, conventional lithography masks typically use Manhattan patterns for IC features, which include polygons with straight edges (e.g., rectangles, squares, etc.). In older semiconductor technology nodes, the IC features fabricated on a wafer (using the conventional lithography masks) can reasonably approximate the Manhattan patterns on the lithography masks. However, as device size scaling down continues, the geometries on the lithography mask may deviate significantly from the actually-fabricated IC features and their respective Manhattan patterns on the wafer. While the deviation may enhance the process window of fabrication, it also creates modeling challenges.

ILT resolves the above problem by treating optical proximity correction (OPC) as an inverse imaging problem and computes a lithography mask pattern using an entire area of a design pattern rather than just edges of the design pattern. While ILT may in some cases produce unintuitive mask patterns (such as freeform or arbitrary-shaped patterns that do not have straight or linear edges), ILT may be used to fabricate masks having high fidelity and/or substantially improved depth-of-focus and exposure latitude, thereby enabling printing of features (i.e., geometric patterns) that may otherwise have been unattainable.

However, ILT may present other challenges as well. For example, conventional techniques of modeling lithography masks are optimized for Manhattan patterns. In other words, these conventional lithography mask modeling techniques assume the patterns on the lithography mask only have straight or linear edges. Since ILT uses lithography masks with patterns that have non-straight or curvilinear edges (e.g., patterns having arbitrary angles), conventional mask lithography modeling does not work well for ILT masks.

The present disclosure overcomes the problem discussed above by generating two-dimensional kernels that can be rotated fast in order to accurately model an ILT lithography mask having the freeform or arbitrary mask patterns. The various aspects of the present disclosure are discussed in more detail below with reference to FIGS. 1-21.

FIG. 1 is a simplified block diagram of an embodiment of an integrated circuit (IC) manufacturing system 100 and an IC manufacturing flow associated therewith, which may benefit from various aspects of the present disclosure. The IC manufacturing system 100 includes a plurality of entities, such as a design house 120, a mask house 130, and an IC manufacturer 150 (i.e., a fab), that interact with one another in the design, development, and manufacturing cycles and/or services related to manufacturing an integrated circuit (IC) device 160. The plurality of entities are connected by a communications network, which may be a single network or a variety of different networks, such as an intranet and the Internet, and may include wired and/or wireless communication channels. Each entity may interact with other entities and may provide services to and/or receive services from the other entities. One or more of the design house 120, mask house 130, and IC manufacturer 150 may have a common owner, and may even coexist in a common facility and use common resources.

In various embodiments, the design house 120, which may include one or more design teams, generates an IC design layout 122. The IC design layout 122 may include various geometrical patterns designed for the fabrication of the IC device 160. By way of example, the geometrical patterns may correspond to patterns of metal, oxide, or semiconductor layers that make up the various components of the IC device 160 to be fabricated. The various layers combine to form various features of the IC device 160. For example, various portions of the IC design layout 122 may include features such as an active region, a gate electrode, source and drain regions, metal lines or vias of a metal interconnect, openings for bond pads, as well as other features known in the art which are to be formed within a semiconductor substrate (e.g., such as a silicon wafer) and various material layers disposed on the semiconductor substrate. In various examples, the design house 120 implements a design procedure to form the IC design layout 122. The design procedure may include logic design, physical design, and/or place and route. The IC design layout 122 may be presented in one or more data files having information related to the geometrical patterns which are to be used for fabrication of the IC device 160. In some examples, the IC design layout 122 may be expressed in a GDSII file format or DFII file format.

In some embodiments, the design house 120 may transmit the IC design layout 122 to the mask house 130, for example, via the network connection described above. The mask house 130 may then use the IC design layout 122 to manufacture one or more masks to be used for fabrication of the various layers of the IC device 160 according to the IC design layout 122. In various examples, the mask house 130 performs mask data preparation 132, where the IC design layout 122 is translated into a form that can be physically written by a mask writer, and mask fabrication 144, where the design layout prepared by the mask data preparation 132 is modified to comply with a particular mask writer and/or mask manufacturer and is then fabricated. In the example of FIG. 1, the mask data preparation 132 and mask fabrication 144 are illustrated as separate elements; however, in some embodiments, the mask data preparation 132 and mask fabrication 144 may be collectively referred to as mask data preparation.

In some examples, the mask data preparation 132 includes application of one or more resolution enhancement technologies (RETs) to compensate for potential lithography errors, such as those that can arise from diffraction, interference, or other process effects. In some examples, optical proximity correction (OPC) may be used to adjust line widths depending on the density of surrounding geometries, add "dog-bone" end-caps to the end of lines to prevent line end shortening, correct for electron beam (e-beam) proximity effects, or for other purposes as known in the art. For example, OPC techniques may add sub-resolution assist features (SRAFs), which for example may include adding scattering bars, serifs, and/or hammerheads to the IC design layout 122 according to optical models or rules such that, after a lithography process, a final pattern on a wafer is improved with enhanced resolution and precision. The mask data preparation 132 may also include further RETs, such as off-axis illumination (OAI), phase-shifting masks (PSM), other suitable techniques, or combinations thereof.

One technique that may be used in conjunction with OPC is inverse lithography technology (ILT), which treats OPC as an inverse imaging problem and computes a mask pattern using an entire area of a design pattern rather than just edges of the design pattern. While ILT may in some cases produce unintuitive mask patterns, ILT may be used to fabricate masks having high fidelity and/or substantially improved depth-of-focus and exposure latitude, thereby enabling printing of features (i.e., geometric patterns) that may otherwise have been unattainable. In some embodiments, an ILT process may be more generally referred to as a model-based (MB) mask correction process. To be sure, in some examples, other RET techniques such as those described above and which may use a model, for example, to calculate SRAF shapes, etc. may also fall within the scope of a MB mask correction process.

The mask data preparation 132 may further include a mask rule checker (MRC) that checks the IC design layout that has undergone one or more RET processes (e.g., OPC, ILT, etc.) with a set of mask creation rules which may contain certain geometric and connectivity restrictions to ensure sufficient margins, to account for variability in semiconductor manufacturing processes, etc. In some cases, the MRC modifies the IC design layout to compensate for limitations which may be encountered during mask fabrication 144, which may modify part of the modifications performed by the one or more RET processes in order to meet mask creation rules.

In some embodiments, the mask data preparation 132 may further include lithography process checking (LPC) that simulates processing that will be implemented by the IC manufacturer 150 to fabricate the IC device 160. The LPC may simulate this processing based on the IC design layout 122 to create a simulated manufactured device, such as the IC device 160. The processing parameters in LPC simulation may include parameters associated with various processes of the IC manufacturing cycle, parameters associated with tools used for manufacturing the IC, and/or other aspects of the manufacturing process. By way of example, LPC may take into account various factors, such as aerial image contrast, depth of focus ("DOF"), mask error enhancement factor ("MEEF"), other suitable factors, or combinations thereof. The simulated processing (e.g., implemented by the LPC) can be used to provide for the generation of a process-aware rule table (e.g., for SRAF insertions). Thus, an SRAF rule table may be generated for the specific IC design layout 122, with consideration of the processing conditions of the IC manufacturer 150.

In some embodiments, after a simulated manufactured device has been created by LPC, if the simulated device layout is not close enough in shape to satisfy design rules, certain steps in the mask data preparation 132, such as OPC and MRC, may be repeated to refine the IC design layout 122 further. In such cases, the previously generated SRAF rule table may also be updated.

It should be understood that the above description of the mask data preparation 132 has been simplified for the purposes of clarity, and data preparation may include additional features such as a logic operation (LOP) to modify the IC design layout according to manufacturing rules. Additionally, the processes applied to the IC design layout 122 during data preparation 132 may be executed in a variety of different orders.

After mask data preparation 132 and during mask fabrication 144, a mask or a group of masks may be fabricated based on the modified IC design layout. The mask can be formed in various technologies. In an embodiment, the mask is formed using binary technology. In some embodiments, a mask pattern includes opaque regions and transparent regions. A radiation beam, such as an ultraviolet (UV) beam, used to expose a radiation-sensitive material layer (e.g., photoresist) coated on a wafer, is blocked by the opaque region and transmitted through the transparent regions. In one example, a binary mask includes a transparent substrate (e.g., fused quartz) and an opaque material (e.g., chromium) coated in the opaque regions of the mask. In some examples, the mask is formed using a phase shift technology. In a phase shift mask (PSM), various features in the pattern formed on the mask are configured to have a pre-configured phase difference to enhance image resolution and imaging quality. In various examples, the phase shift mask can be an attenuated PSM or alternating PSM.

In some embodiments, the IC manufacturer 150, such as a semiconductor foundry, uses the mask (or masks) fabricated by the mask house 130 to transfer one or more mask patterns onto a production wafer 152 and thus fabricate the IC device 160 on the production wafer 152. The IC manufacturer 150 may include an IC fabrication facility that may include a myriad of manufacturing facilities for the fabrication of a variety of different IC products. For example, the IC manufacturer 150 may include a first manufacturing facility for front end fabrication of a plurality of IC products (i.e., front-end-of-line (FEOL) fabrication), while a second manufacturing facility may provide back end fabrication for the interconnection and packaging of the IC products (i.e., back-end-of-line (BEOL) fabrication), and a third manufacturing facility may provide other services for the foundry business.

In various embodiments, the semiconductor wafer (i.e., the production wafer 152) within and/or upon which the IC device 160 is fabricated may include a silicon substrate or other substrate having material layers formed thereon. Other substrate materials may include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. In some embodiments, the semiconductor wafer may further include various doped regions, dielectric features, and multilevel interconnects (formed at subsequent manufacturing steps). Moreover, the mask (or masks) may be used in a variety of processes. For example, the mask (or masks) may be used in an ion implantation process to form various doped regions in the semiconductor wafer, in an etching process to form various etching regions in the semiconductor wafer, and/or in other suitable processes.

It is understood that the IC manufacturer 150 may use the mask (or masks) fabricated by the mask house 130 to transfer one or more mask patterns onto a research and development (R&D) wafer 154. One or more photolithography processes may be performed on the R&D wafer 154. After photolithography processing of the R&D wafer 154, the R&D wafer 154 may then be transferred to a test lab (e.g., metrology lab or parametric test lab) for empirical analysis 156. Empirical data from the R&D wafer 154 may be collected and then transferred to the mask house 130 to facilitate the data preparation 132.

Figure 2:
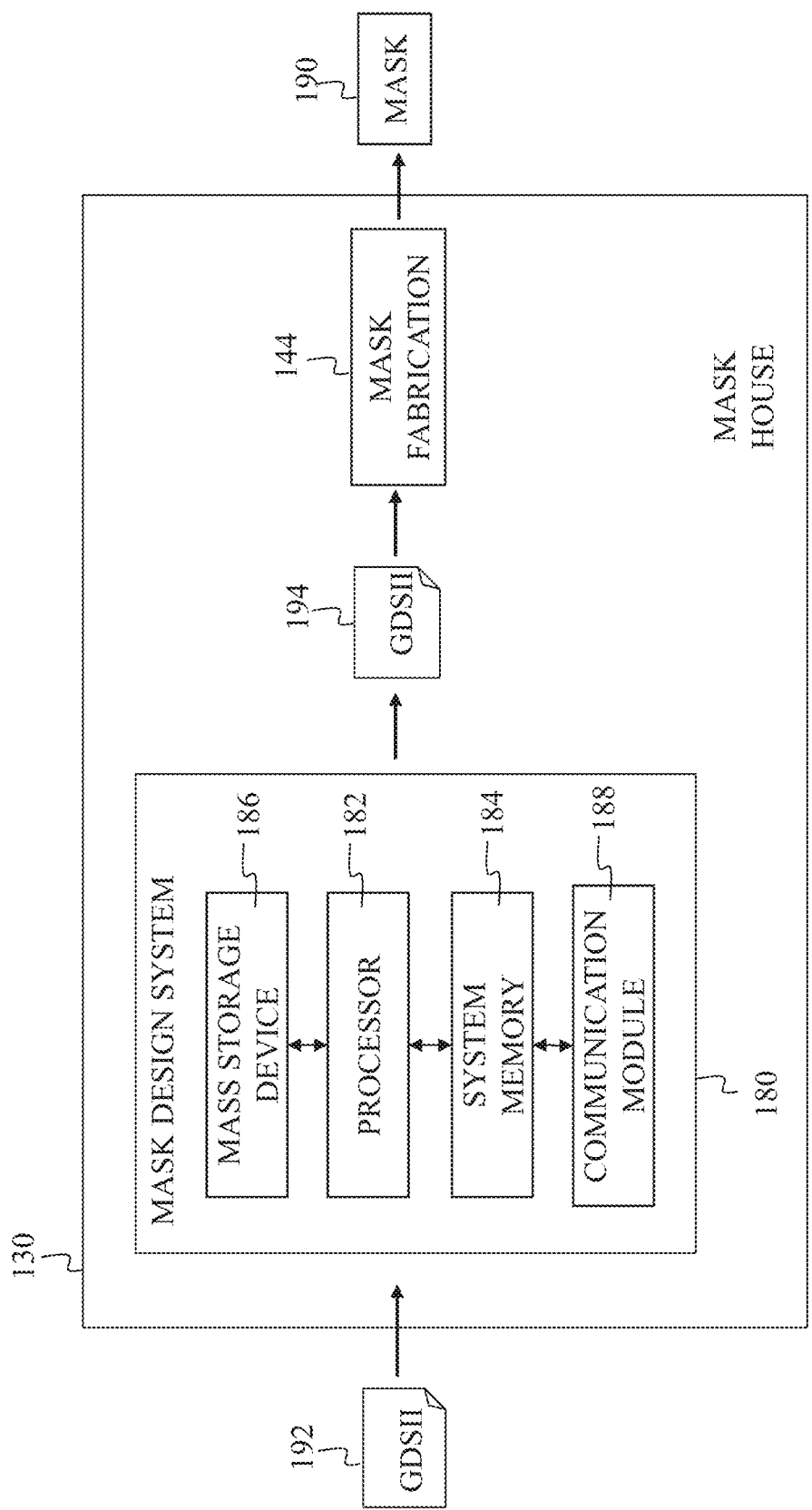
FIG. 2 is a detailed block diagram of the mask house according to various aspects of the present disclosure.

FIG. 2 is a more detailed block diagram of the mask house 130 shown in FIG. 1 according to various aspects of the present disclosure. In the illustrated embodiment, the mask house 130 includes a mask design system 180 that is operable to perform the functionality described in association with mask data preparation 132 of FIG. 1. The mask design system 180 is an information handling system such as a computer, server, workstation, or other suitable device. The system 180 includes a processor 182 that is communicatively coupled to a system memory 184, a mass storage device 186, and a communication module 188. The system memory 184 provides the processor 182 with non-transitory, computer-readable storage to facilitate execution of computer instructions by the processor. Examples of system memory may include random access memory (RAM) devices such as dynamic RAM (DRAM), synchronous DRAM (SDRAM), solid state memory devices, and/or a variety of other memory devices known in the art. Computer programs, instructions, and data are stored on the mass storage device 186. Examples of mass storage devices may include hard discs, optical disks, magneto-optical discs, solid-state storage devices, and/or a variety other mass storage devices. The communication module 188 is operable to communicate information such as IC design layout files with the other components in the IC manufacturing system 100, such as design house 120. Examples of communication modules may include Ethernet cards, 802.11 WiFi devices, cellular data radios, and/or other suitable devices.

In operation, the mask design system 180 is configured to manipulate the IC design layout 122 according to a variety of design rules and limitations before it is transferred to a mask 190 by mask fabrication 144. For example, in an embodiment, mask data preparation 132, including OPC, ILT, MRC, and/or LPC, may be implemented as software instructions executing on the mask design system 180. In such an embodiment, the mask design system 180 receives a first GDSII file 192 containing the IC design layout 122 from the design house 120. After the mask data preparation 132 is complete, the mask design system 180 transmits a second GDSII file 194 containing a modified IC design layout to mask fabrication 144. In alternative embodiments, the IC design layout may be transmitted between the components in IC manufacturing system 100 in alternate file formats such as DFII, CIF, OASIS, or any other suitable file type. Further, the mask design system 180 and the mask house 130 may include additional and/or different components in alternative embodiments.

In lithography, the near field of a binary mask pattern resembles the mask pattern but has blurred pattern edge. Therefore, it can be approximated by the thin mask model that assigns two different constant field values to areas occupied or not occupied by patterns respectively. To improve the accuracy of the near field model, a correction unit—also referred to as a kernel—needs to be determined. Once determined, the kernel is applied along the (sharp) edge of the mask pattern to generate a correction field that will be added to the thin mask field. This will generate a field with a blurred edge that closely resembles the true near field of the mask.

Figure 3:
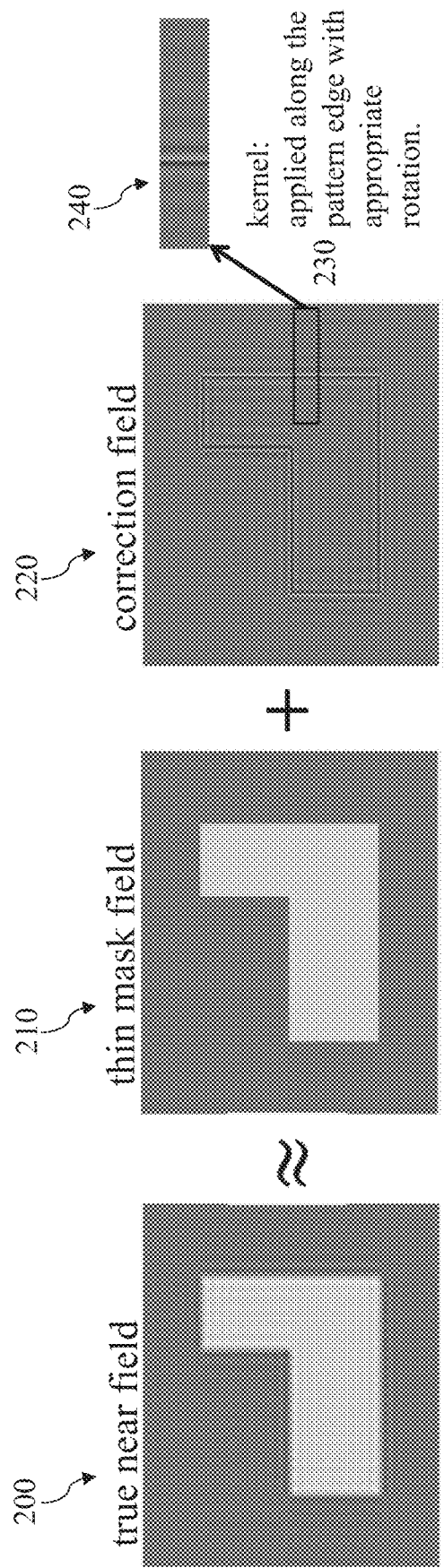
FIG. 3 is a graphical illustration of how a near field of a mask is generated according to various aspects of the present disclosure.

FIG. 3 is a graphical illustration of how a near field of a mask is generated using the above process (i.e., by applying a kernel-containing-correction-field to a thin mask field). For example, the true near field 200 of a polygonal mask pattern is shown in FIG. 3. As can be seen in FIG. 3, the true near field 200 has blurred edges. The true near field 200 can be approximated by combining a thin mask field 210 with a correction field 220. The thin mask field 210 has sharp edges (i.e., not blurry). The correction field 220 includes kernels 230, some examples of which are illustrated in a magnified window 240 in FIG. 3. An accurate kernel is indispensable for the accurate simulation of the true near field of any mask pattern.

Note that the kernel 230 in FIG. 3 is a one-dimensional kernel that only varies along one dimension and is uniform along the other dimension. A one-dimensional kernel works fine for Manhattan patterns such as the pattern shown in FIG. 3. However, for non-Manhattan patterns, for example curved patterns or patterns with arbitrary angles that are used in ILT, the one-dimensional kernels may be insufficient to generate an accurate correction field, and as such it may be difficult to use the one-dimensional kernels to generate an accurate near field. To overcome this problem, the present disclosure uses two-dimensional kernels that can be quickly rotated. These two-dimensional kernels are used to generate the correction field, which is then applied to the thin mask field to generate an accurate near field for the non-Manhattan patterns used in ILT, as discussed below in more detail.

Figure 4:
FIG. 4 is a flowchart of a method illustrating a process flow according to various aspects of the present disclosure.

FIG. 4 is a flowchart of a method 300 that illustrates an overall flow of an embodiment of the present disclosure.

The method 300 includes a step 310, in which a mask layout is loaded. The mask layout may be for an ILT mask, which as discussed above may contain non-Manhattan shapes that are optimized for certain IC patterns. For example, the mask layout loaded herein may include curvilinear pattern edges.

The method 300 includes a step 320, in which the mask layout loaded in step 310 undergoes pre-processing. In some embodiments, the pre-processing may include steps such as rasterization and/or anti-aliasing filtering. Rasterization refers to the task of taking an image described in a vector graphics format (e.g., including the polygonal shapes of the mask patterns) and converting it into a raster image that comprises pixels or dots. In this process, a high resolution result may be obtained. However, such a high resolution may not be needed, and thus the high resolution may be down-converted to a lower resolution. This down-conversion process may involve signal processing that could result in aliasing. For high frequency aliasing components that are not of interest, they may be filtered out by the anti-aliasing filtering step.

The method 300 includes a step 330, in which an edge distribution and orientation maps of the non-Manhattan patterns are built for the mask layout that is processed in step 320. The details of step 330 will be discussed in greater detail below.

The method 300 includes a step 340, in which different rotationally decomposed kernels (e.g., two-dimensional kernels) are applied to the edge and orientation maps to get edge correction (for the non-Manhattan patterns). In other words, the step 340 obtains the correction field similar to the correction field 220 shown in FIG. 3, though the correction field herein uses two-dimensional kernels. The details of step 340 will also be discussed in greater detail below.

The method 300 includes a step 350, in which a thin mask model is applied to the processed mask layout obtained in step 320. As discussed above, the thin mask model contains binary modeling of the patterns on the mask. In other words, the thin mask model describes the mask patterns as having sharp edges (e.g., black and white). When the thin mask model is applied to the processed mask layout, a thin mask field (e.g., the thin mask field 210 in FIG. 3) may be obtained as a result. Of course, since the present disclosure may use non-Manhattan patterns on the mask, the thin mask field obtained herein may also have non-Manhattan shapes.

The method 300 includes a step 360, in which the thin mask result (obtained in step 350) and the edge correction (obtained in steps 340) are combined to obtain a near field. Again, the edge correction may be viewed as the correction field similar to the correction field in FIG. 3 (though with two-dimensional kernels). The kernels of the correction field may be applied along the edge of the mask pattern to generate the correction field that adds a blurred edge to the thin mask field to approximate the true near field of the mask patterns.

The method 300 includes a step 370, in which an optical model is applied to the near field (obtained in step 360) to obtain an aerial image on the wafer. The step 370 may also be viewed as performing an exposure simulation.

The method 300 includes a step 380, in which a photoresist model is applied to the aerial image to obtain a final photoresist image on the wafer. The step 380 may also be viewed as performing a photoresist simulation.

The steps 330 and 340 are now discussed in more detail with reference to FIG. 5, which is a graphical illustration of an example non-Manhattan pattern 400 and a plurality of example two-dimensional kernels 411-416 for the non-Manhattan pattern 400. The non-Manhattan pattern 400 is displayed in a grid of pixels, where each pixel has an X-axis dimension $\Delta x$ and a Y-axis dimension $\Delta y$. In some embodiments, $\Delta x$ and $\Delta y$ are each in a range from 1 nanometer (nm) to 32 nm. The non-Manhattan pattern 400 contains curvilinear edges. The non-Manhattan pattern 400 may also be said to have arbitrary angles (rather than angles of 0, 90, 180, and 270 degrees, as would have been the case with Manhattan patterns). It is understood that since the pattern 400 does not have distinctly separate edge segments, it may be considered to have a single continuous edge as well, where the edge is composed of a plurality of points that each have a two-dimensional kernel associated therewith.

The pixels on which the edge(s) of the non-Manhattan pattern 400 is located are referred to as edge pixels. A gradient (or a gradient magnitude) of the pattern may be taken in order to identify these edge pixels. Depending on the gradient method and the anti-aliasing filter applied, the edges may be several-pixel wide. The edge pixels are displayed in FIG. 5 with visual emphasis. Each of these edge pixels contains a segment of the edge of the non-Manhattan pattern 400. The orientation of the segment of the edge in each pixel may be determined by taking the normal line (also referred to as the normal vector) of that edge segment. A normal line/vector to a surface refers to a line/vector that is perpendicular or orthogonal to that surface. Thus, the normal line/vector associated with any edge pixel is the line/vector that is perpendicular or orthogonal to the segment of the edge in that particular pixel.

After the edge pixels have been identified (e.g., by taking the gradient), and the orientation of the edge segment in each pixel has been determined (e.g., by determining the normal line/vector), a two-dimension kernel is applied to the respective edge segment in each pixel. The two dimensional kernels may each have their own orientation angle, which is the orientation of the edge segment of the corresponding pixel. In other words, the two-dimensional kernels are rotated differently along the edge of the non-Manhattan pattern 400, each as a function of the orientation of the corresponding edge of the non-Manhattan pattern 400.

Figure 5:
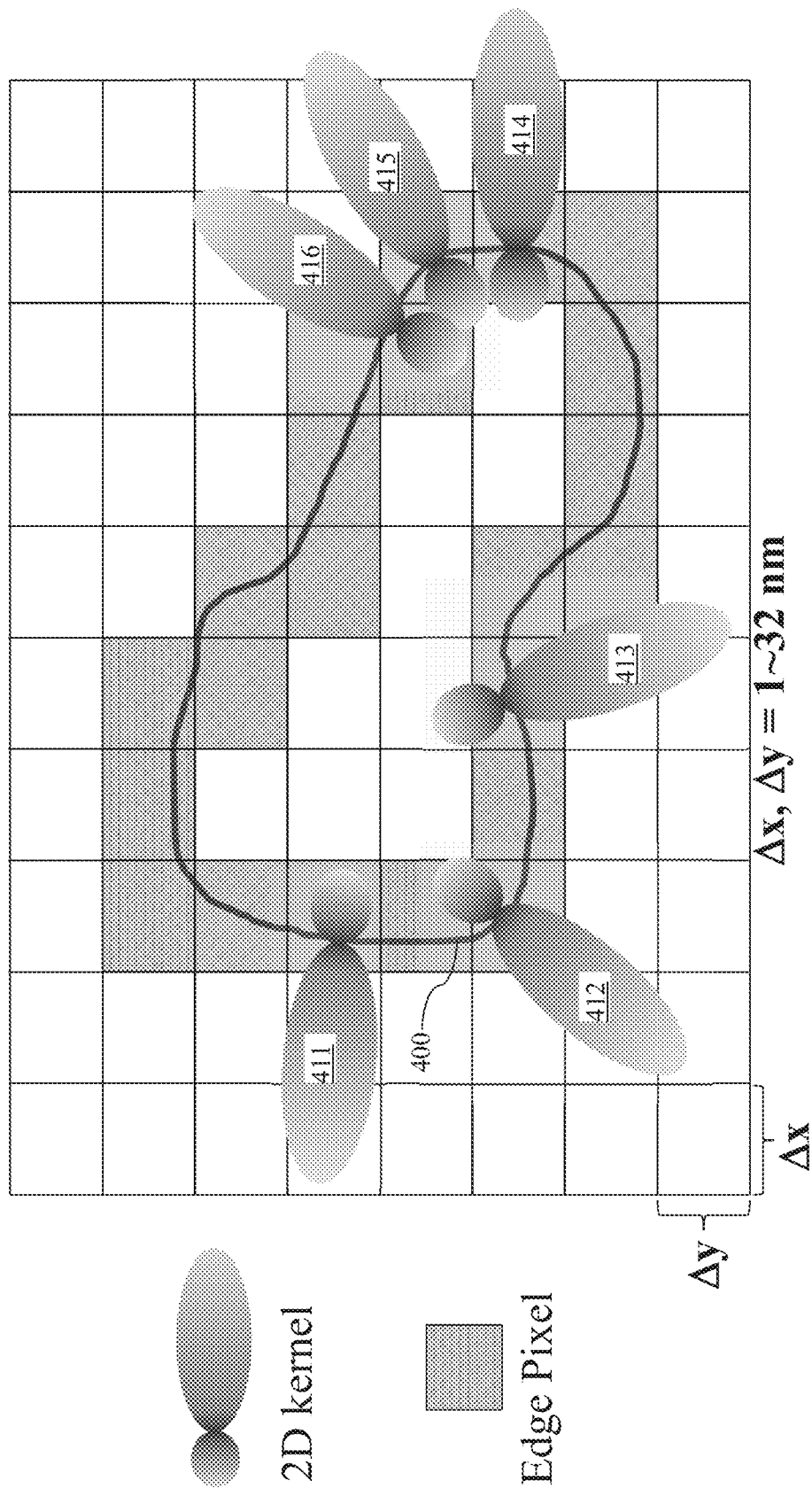
FIG. 5 is a graphical illustration of an example non-Manhattan pattern and a plurality of two-dimensional kernels for that pattern according to various aspects of the present disclosure.

FIG. 5 illustrates two-dimensional kernels 411-416 as examples of the above concept. For example, the two-dimensional kernel 411 has a first orientation angle, the two-dimensional kernel 412 has a second orientation angle, the two-dimensional kernel 413 has a third orientation angle, the two-dimensional kernel 414 has a fourth orientation angle, the two-dimensional kernel 415 has a fifth orientation angle, and the two-dimensional kernel 416 has a sixth orientation angle. The first, second, third, fourth, fifth, and sixth orientation angles are all different from one another.

One of the novel aspects of the present disclosure involves a method to quickly and accurately determine the various rotated two-dimensional kernels that should be applied around the edge of the non-Manhattan pattern 400. This method is graphically illustrated in FIG. 6, which illustrates the decomposition and rotation of the two-dimensional kernels. First, an example two-dimensional kernel 450 is provided. The two-dimensional kernel 450 has not been rotated yet, in other words, it has a 0 degree rotation. Since the kernel 450 is two-dimensional, it has two degrees of freedom, which in this case can be expressed using polar coordinates. For example, the two-dimensional kernel 450's polar coordinates can be expressed as $f_{2D}(r, \theta)$, where the "2D" signifies that it is two-dimensional in nature, the "r" represents the radius part (also referred to as the radial coordinate) of the polar coordinates, and the "$\theta$" represents the angle part (also referred to as the angular coordinate or pole angle) of the polar coordinates.

Figure 6:
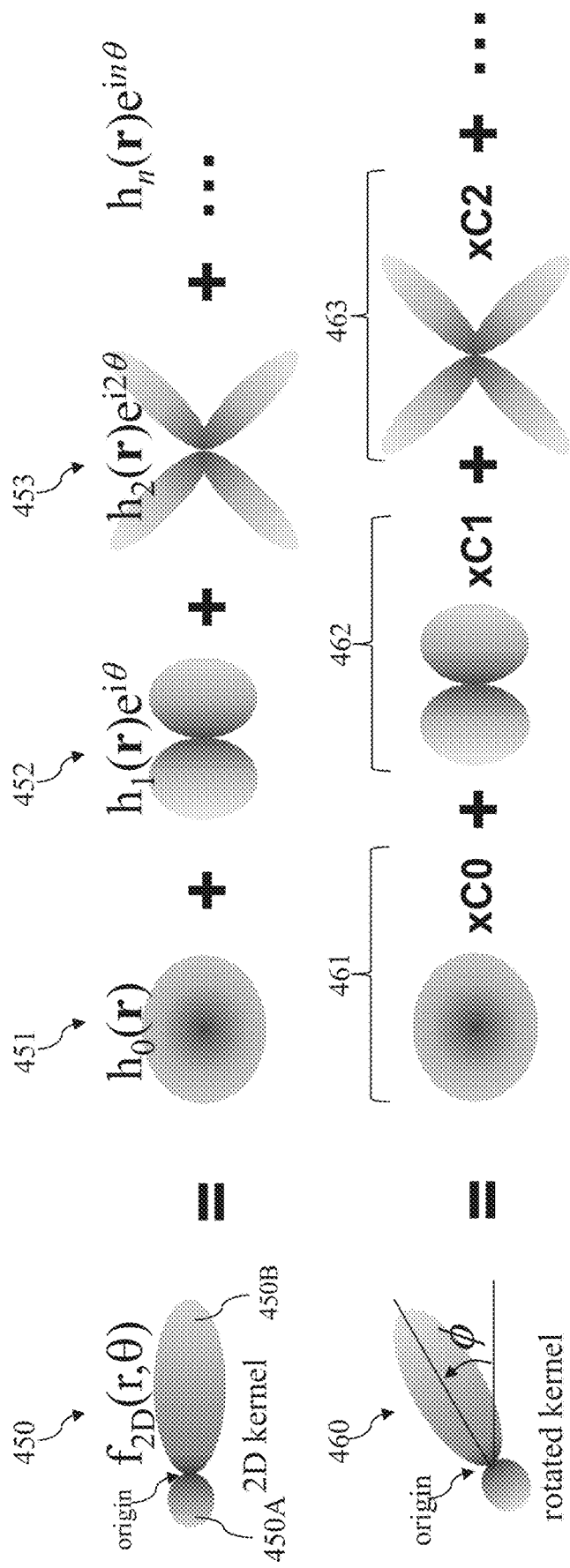
FIG. 6 is a graphical illustration of a decomposition and rotation of the two-dimensional kernels according to various aspects of the present disclosure.

As is shown in FIG. 6, the two-dimensional kernel 450 in this embodiment includes a portion 450A and a portion 450B that is larger than the portion 450A. The portions 450A and 450B are joined together at a point that also corresponds to the origin (i.e., r=0) of the polar coordinate system. In FIG. 5, the two-dimensional kernel intersects with each edge pixel at the kernel origin.

The two-dimensional kernel 450 is decomposed into a plurality of components, some examples of which are shown in FIG. 6 as decomposed components 451, 452, and 453. The decomposed components with different rotational symmetry are expressed in the form of $h_n(r)e^{in\theta}$, where "n" is the sequential number of the decomposed component. Thus, "n" is 0 for the decomposed component 451, "n" is 1 for the decomposed component 452, and "n" is 2 for the decomposed component 453. It is understood that "n" covers all integers (positive, negative and 0) and can vary from $-\infty$ to $\infty$. "r" and "$\theta$" are the radial and angular coordinates, respectively. "i" is the square root of negative 1.

It is understood that theoretically, the two-dimensional kernel 450 may be decomposed into an infinite number of components. The greater the number of decomposed components, the more accurate the decomposed components will be able to approximate the two-dimensional kernel 450. In reality, however, a few decomposed components is typically enough to provide a sufficiently accurate representation of the two-dimensional kernel 450.

As the two-dimensional kernel 450 is rotated into a two-dimensional kernel 460, which can be decomposed into a plurality of components, some examples of which are shown in FIG. 6 as decomposed components 461, 462, and 463. Again, the two-dimensional kernel 460 may be expressed as an infinite number of decomposed components, but a few decomposed components may be sufficient to approximate the two-dimensional kernel 460 accurately. The decomposed components 461-463 are related to (or are functions of) the decomposed components 451-453, respectively. For example, the decomposed component 461 is the product of the decomposed component 451 and a constant C0, the decomposed component 462 is the product of the decomposed component 452 and a constant C1, and the decomposed component 463 is the product of the decomposed component 453 and a constant C2. In the embodiment shown in FIG. 6, C0=1, C1=exp (−iφ), C2=exp (−i2φ), where "exp(x)" refers to the natural exponential function, i.e., same as $e^x$. In embodiments where the number of decomposed components is n, then the constant Cn may be expressed as exp(−inφ), where "n" is the sequential number of the decomposed component. As discussed above, "n" covers all integers and can vary from −∞ to ∞.

Note that θ and φ represent different things. As discussed above, θ represents the angular coordinate of the two-dimensional kernel, which depends on the location of the two-dimensional kernel in FIG. 5, whereas φ represents the rotation angle (i.e., the orientation angle determined by taking the normal line/vector of each edge pixel) of the two-dimensional kernel in FIG. 5.

It can be seen that since the decomposed components 461-463 can be derived from the decomposed components 451-453 merely by multiplying the decomposed components 451-453 with their respective constants C0, C1, and C2, the rotation of the two-dimensional kernel 450 (into the rotated two-dimensional kernel 460) can be performed more quickly and more accurately than the conventional rotation that transforms the coordinate from (x, y) to (x cos φ+y sin φ, y cos φ−x sin φ).

Figure 7:
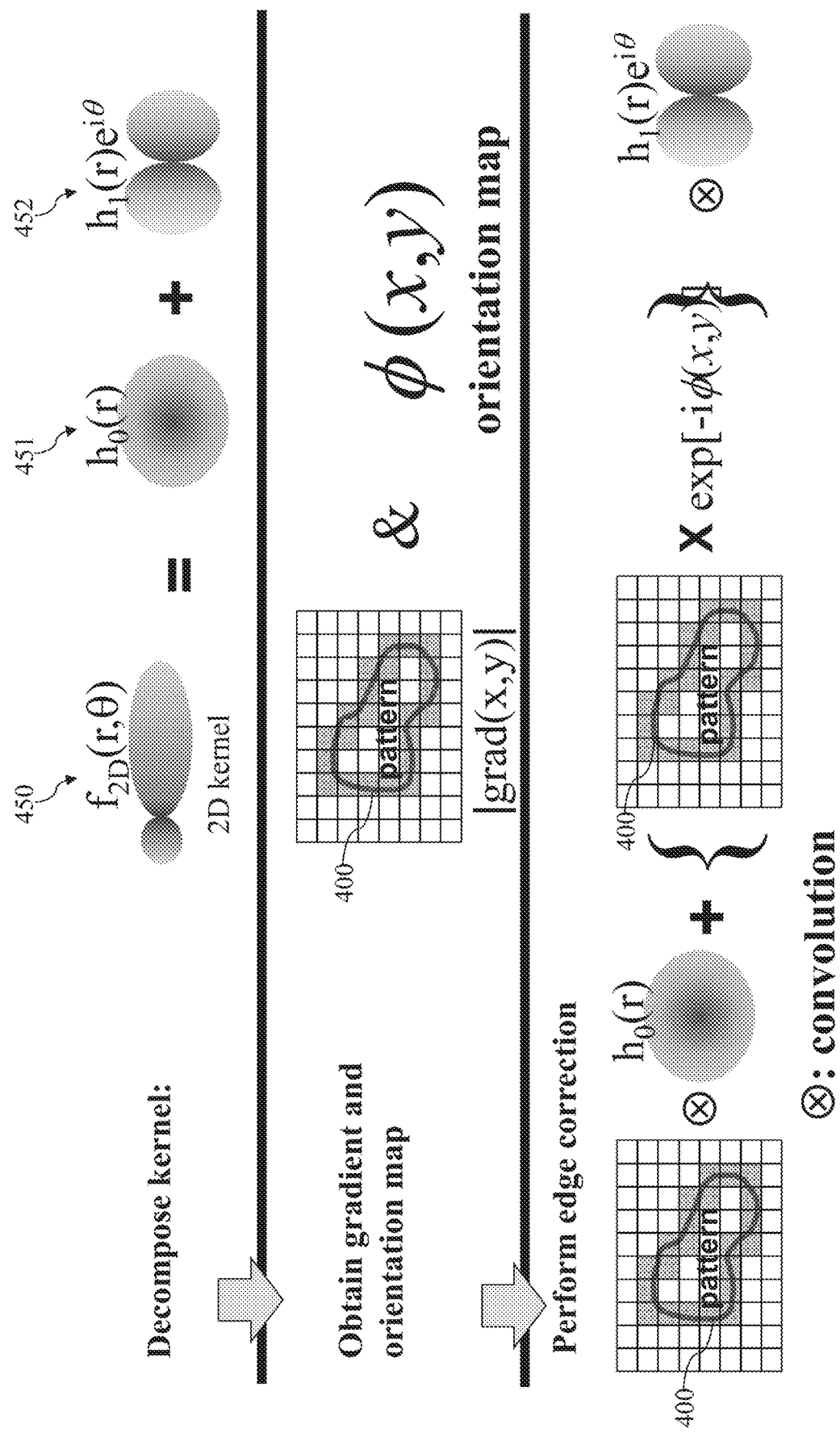
FIG. 7 is a graphical illustration of how to use two-dimensional kernels to perform an edge correction process for a non-Manhattan mask pattern according to various aspects of the present disclosure.

FIG. 7 is a graphical illustration of how to use two-dimensional kernels to perform an edge correction process for the non-Manhattan mask pattern 400 according to an example of the present disclosure. The first step of this process is to decompose the two-dimensional kernel 450. This decomposition process is similar to the one discussed above with reference to FIG. 6. However, rather than decomposing the two-dimensional kernel 450 into three components, the embodiment shown in FIG. 7 decomposes the two-dimensional kernel 450 into two components 451 and 452, where the component 451 is expressed as $h_0(r)$, and the component 452 is expressed as $h_1(r)e^{i\theta}$. Of course, it is understood that the two components 451 and 452 are just an example, and the two-dimensional kernel 450 may be decomposed into any other number of components in alternative embodiments.

The second step of this process shown in FIG. 7 is to obtain the gradient and the orientation map. The gradient of the pattern 400 is obtained as a magnitude and expressed as |grad(x,y)|. The edge pixels may be identified based on the gradient. As discussed above, the orientation map refers to the angle associated with the normal line/vector for each edge pixel. In other words, for each of the edge pixels, the normal line/vector has a corresponding angle or orientation, and the angle/orientation for all the edge pixels collectively may be considered an orientation map. For the sake of simplicity, the orientation map is mathematically expressed herein as φ(x,y). Note that φ(x,y) and φ may be used interchangeably throughout the present disclosure, where φ may be a shorthand notation of φ(x,y).

The third step of this process shown in FIG. 7 is to perform the edge correction process. As a part of the edge correction process, the gradient magnitude |grad(x,y)| is convolved with the decomposed component 451, and the gradient magnitude |grad(x,y)| is also multiplied with exp [−iφ(x,y)] (in other words, multiplied with the constant C1 discussed above with reference to FIG. 6), and then convolved with the decomposed component 451.

The results of the two convolutions are then added together to obtain the edge correction result. The result of the edge correction process represents the correction field (e.g., similar to the correction field 220 shown in FIG. 3, except with two-dimensional kernels rather than one-dimensional kernels) for the non-Manhattan pattern 400. Once the correction field is obtained, the near field (e.g., similar to the true near field 200 shown in FIG. 3, except with a non-Manhattan pattern) of the pattern 400 may be determined by applying the correction field to the thin mask field (e.g., similar to the thin mask field 210 in FIG. 3).

Figure 8:
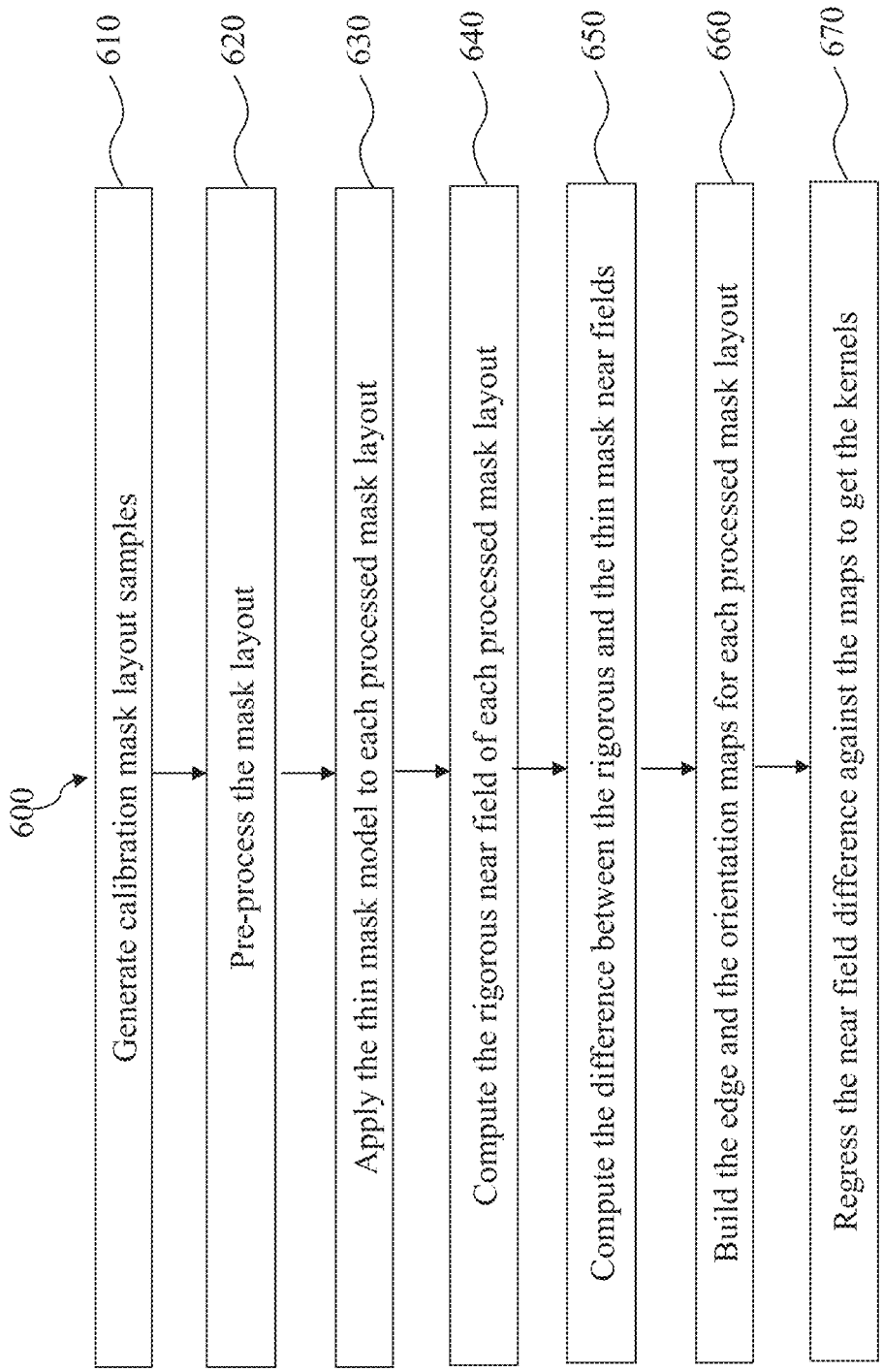
FIG. 8 is a flowchart illustrating a method of preparing the two-dimensional kernels according to various aspects of the present disclosure.

FIG. 8 is a flowchart illustrating a method 600 of preparing the two-dimensional kernels discussed herein. The method 600 includes a step 610, in which calibration mask layout pattern samples are generated. In some embodiments, there may be hundreds of calibration mask layout patterns.

The method 600 includes a step 620, in which the mask layout undergoes preprocessing, for example rasterization and anti-aliasing filtering.

The method 600 includes a step 630, in which the thin mask model is applied to each of the mask patterns processed in step 620.

The method 600 includes a step 640, in which the rigorous near field of each processed mask layout is computed. This may be a computationally intensive process and as such may not be suitable in an actual production environment. However, since the method 600 is directed to a calibration environment, the fact that step 640 is computationally intensive is acceptable.

The method 600 includes a step 650, in which the differences between the rigorous near fields (i.e., the results from step 640) and the thin mask near fields (i.e., the results from step 630) are computed. Step 650 yields the target correction fields.

The method 600 includes a step 660, in which the edge distribution and orientation maps are built for each of the processed calibration mask layout patterns. In other words, the processes discussed above with reference to FIG. 5 are repeated herein for each of the calibration patterns.

The method 600 includes a step 670, in which the near field difference against the maps undergoes regression analysis to get the kernels. As a part of the regression analysis, a plurality of coefficients may be solved. The step 670 may produce a library that can be re-used later to generate the two-dimensional kernels. These two-dimensional kernels can be used for different masks too.

Figure 9:
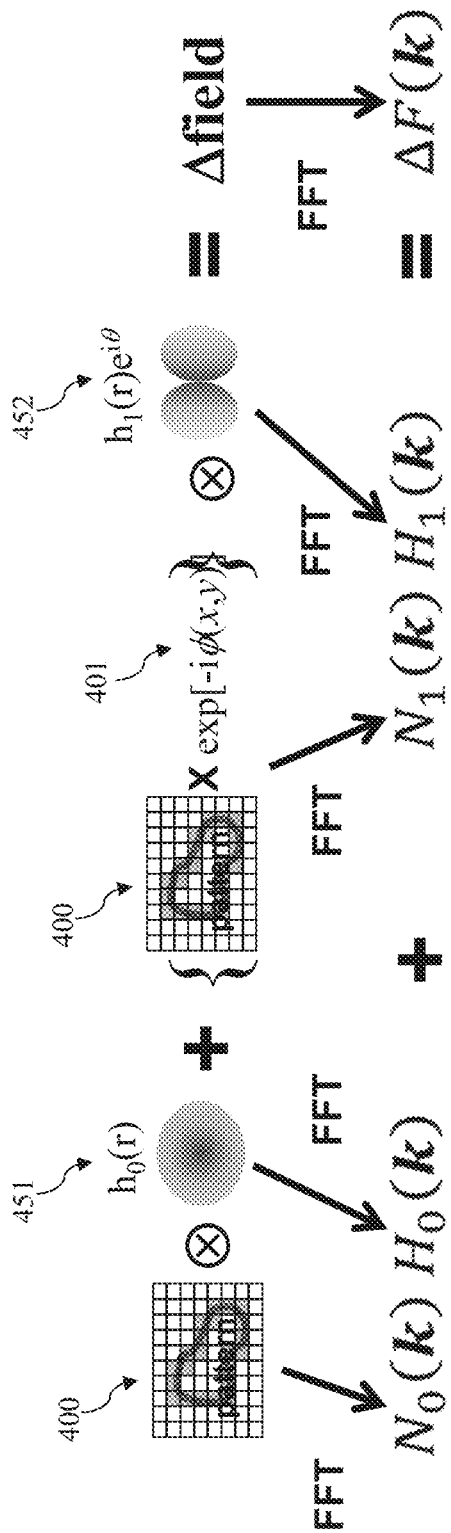
FIG. 9 illustrates a simplified example of how two-dimensional kernels are generated by a regression analysis according to various aspects of the present disclosure.

FIG. 9 illustrates a simplified example of how two-dimensional kernels are generated according to the regression analysis discussed in step 670 above. In FIG. 9, the term "Δfield" represents the results of step 650 of FIG. 8. A Fast Fourier Transform (FFT) is performed to the pattern 400, the product of the pattern 400 and the exponential term 401, and the components 451-452, as shown in FIG. 9. The result is the following equation:

$$N_0(k)H_0(k)+N_1(k)H_1(k)=\Delta F(k)$$

where k is the two-dimensional index in the FFT space $(k=k_1, k_2, \ldots, kv)$.

If M different samples are generated in step 610, performing FFT on every sample will give M equations. Knowing $\Delta F(k)$ from step 650, the following M linear equations are then used to solve for $H_0(k_i)$ and $H_1(k_i)$ by the least square method:

$$N_{01}(k_i)H_0(k_i) + N_{11}(k_i)H_1(k_i) = \Delta F_1(k_i)$$
$$N_{02}(k_i)H_0(k_i) + N_{12}(k_i)H_1(k_i) = \Delta F_2(k_i)$$
$$\vdots$$
$$N_{0M}(k_i)H_0(k_i) + N_{1M}(k_i)H_1(k_i) = \Delta F_M(k_i)$$

The process above will generate a library of two-dimensional kernels including $H_0$ and $H_1$ at every interested $k_i$ that can be reused for many different mask patterns.

FIG. 10 illustrates the non-Manhattan mask pattern 400 and an aerial image 700 projected by the pattern 400 on a wafer. The aerial image 700 may be viewed as an example of the result of the step 370 of FIG. 4, i.e., by applying an optical model to the near field. Based on FIG. 10, it can be seen that the aerial image 700 closely resembles the original non-Manhattan mask pattern 400, meaning that the methods disclosed herein can achieve sufficient accuracy. For example, because the two-dimensional kernels can have any arbitrary angle/orientation, the aerial image 700 generated by the present disclosure does not have unwanted corners or other spurious features that are associated with other methods. In addition, the present disclosure has a time complexity of $O(N^2 \lg N)$ in the "Big O notation" with the fast rotation method, whereas the conventional methods of direct coordinate rotation may have a time complexity of $O(N^4)$, which is too slow to be applied in OPC or ILT computation. Here "N" refers to the size of one side of the two-dimensional simulation clip. Based on the difference between $O(N^2 \lg N)$ and $O(N^4)$, it can be seen that the methods of the present disclosure can be performed much more quickly in rotating a two-dimensional kernel that will provide much better flexibility and accuracy compared to the one-dimensional kernels employed by the conventional methods.

Figure 11:
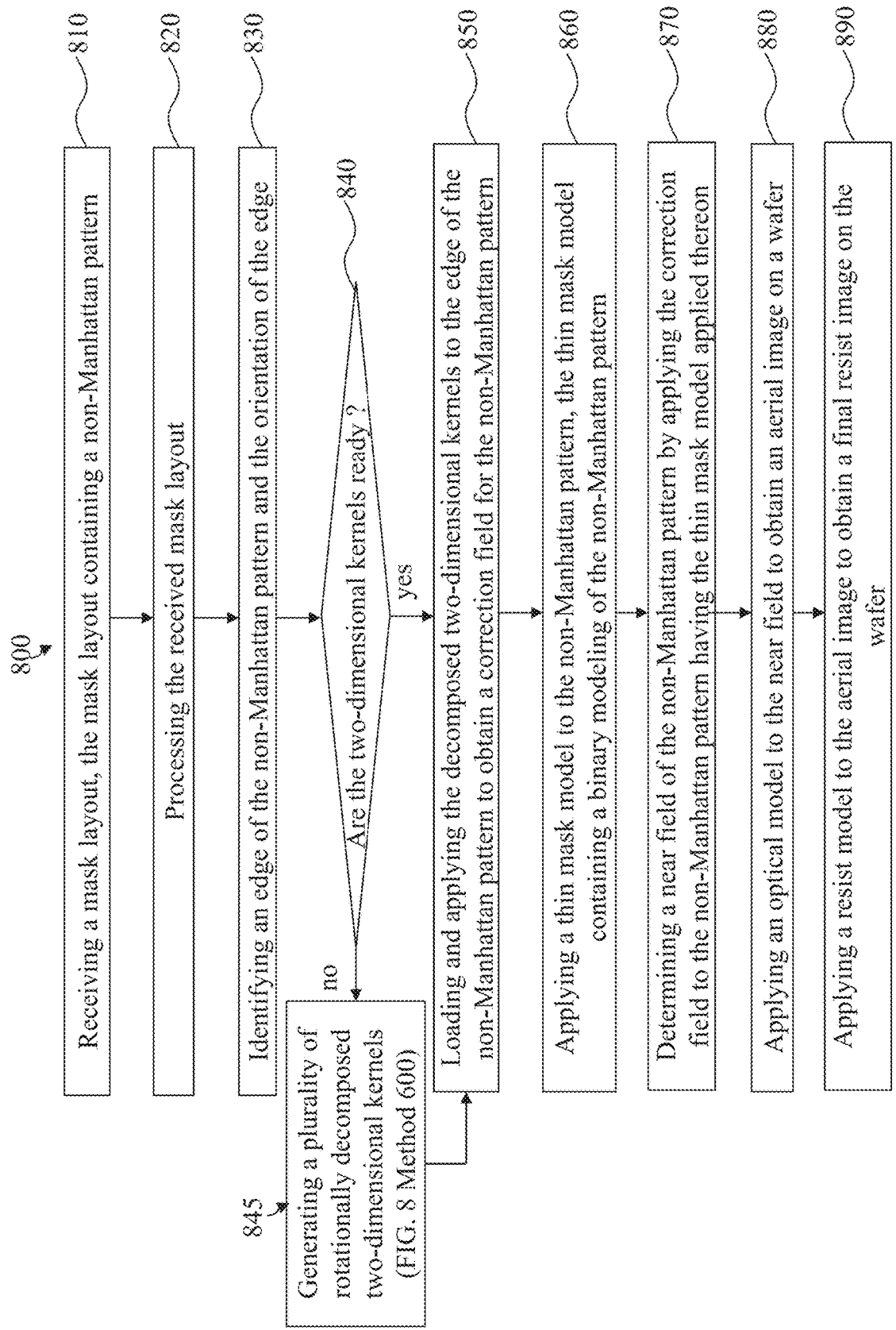
FIG. 11 is a flowchart illustrating a method of modeling a mask according to various aspects of the present disclosure.

FIG. 11 is a flowchart illustrating a method 800 of modeling a mask. The method 800 includes a step 810 of receiving a mask layout, the mask layout containing a non-Manhattan pattern.

The method 800 includes a step 820 of processing the mask layout. In some embodiments, the step 820 involves performing rasterization or anti-aliasing filtering to the mask layout.

The method 800 includes a step 830 of identifying an edge of the non-Manhattan pattern and the orientation of the edge. In some embodiments, the edge may be identified by taking a gradient of the processed mask layout.

The method 800 includes a step 840 of checking whether the decomposed two-dimensional kernels have been generated. If not, the decomposed two-dimensional kernels will be generated by step 845 that calls method 600. The decomposed two-dimensional kernels each have a respective rotational symmetry. In some embodiments, the step 845 involves decomposing each of the two-dimensional kernels into a plurality of components.

The method 800 includes a step 850 of loading and applying the two-dimensional kernels to all the edges of the non-Manhattan pattern to obtain a correction field for the non-Manhattan pattern.

The method 800 includes a step 860 of applying a thin mask model to the non-Manhattan pattern. The thin mask model contains a binary modeling of the non-Manhattan pattern.

The method 800 includes a step 870 of determining a near field of the non-Manhattan pattern by applying the correction field to the non-Manhattan pattern having the thin mask model applied thereon.

The method 800 includes a step 880 of applying an optical model to the near field to obtain an aerial image on a wafer.

The method 800 includes a step 890 of applying a resist model to the aerial image to obtain a final resist image on the wafer.

It is understood that although the method 800 is performed to a mask layout having a non-Manhattan pattern as an example, the method 800 may be applied to mask layouts having Manhattan patterns too. In addition, additional steps may be performed before, during, or after the steps 810-890 herein. For example, the additional steps may include manufacturing a mask, and/or performing semiconductor fabrication using the mask. For reasons of simplicity, these additional steps are not discussed in detail herein.

Figure 12:
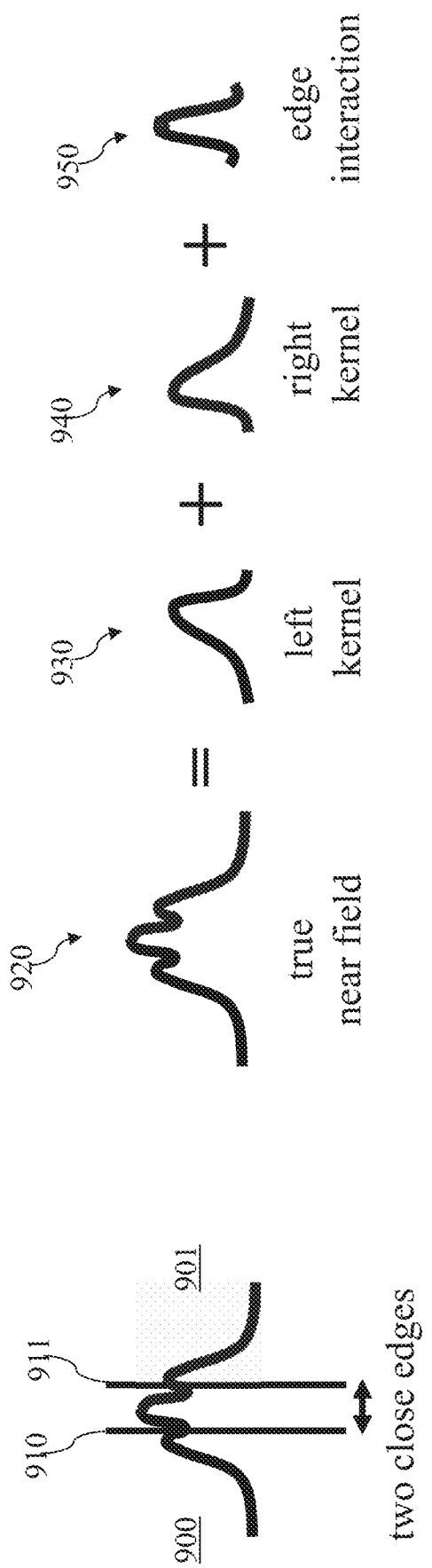
FIG. 12 is a graphical illustration of an edge interaction between two adjacent mask patterns according to various aspects of the present disclosure.

Another aspect of the present disclosure relates to improving the accuracy of mask models by fully taking edge interactions into account. FIG. 12 is a graphical illustration of an edge interaction between two adjacent mask patterns 900 and 901. The patterns 900-901 are located close to each other, such that their respective edges 910-911 interact with each other, which may distort the true near field created by the edges 910-911. In other words, the true near field pattern created by a standalone edge is not the same as the true near field pattern created by that same edge if another edge is located sufficiently close to it. As is shown in FIG. 12, a true near field 920 created by the two closely-located edges 910-911 may include contributions from a kernel 930, a kernel 940, as well as contributions from an edge interaction 950.

As semiconductor device sizes continue to shrink, the spacing between adjacent patterns shrinks too. Whereas edge interactions may not have been a problem in older technology generations having larger device patterns and spacing, the small feature sizes and tight spacing in the newer technology generations may enhance the effects of edge interactions. Unfortunately, due to the many different possibilities of how any two (or more) patterns are located adjacently to one another, conventional methods cannot adequately and accurately account for the edge interaction effects. This is even more true with non-Manhattan patterns (e.g., the pattern 400 discussed above), since their irregularly-shaped edges may present many more different possibilities of how edges are interacting with one another, and as such the non-Manhattan patterns may further complicate the calculations of edge interaction.

The present disclosure involves a method to accurately and quickly determine the edge interaction (and to account for it) for any mask layout, including layouts having non-Manhattan patterns. The improved accuracy will help optimize the process window and improve yield. The various aspects of determining the edge interaction is discussed in more detail below with reference to FIGS. 13-21.

Figure 13:
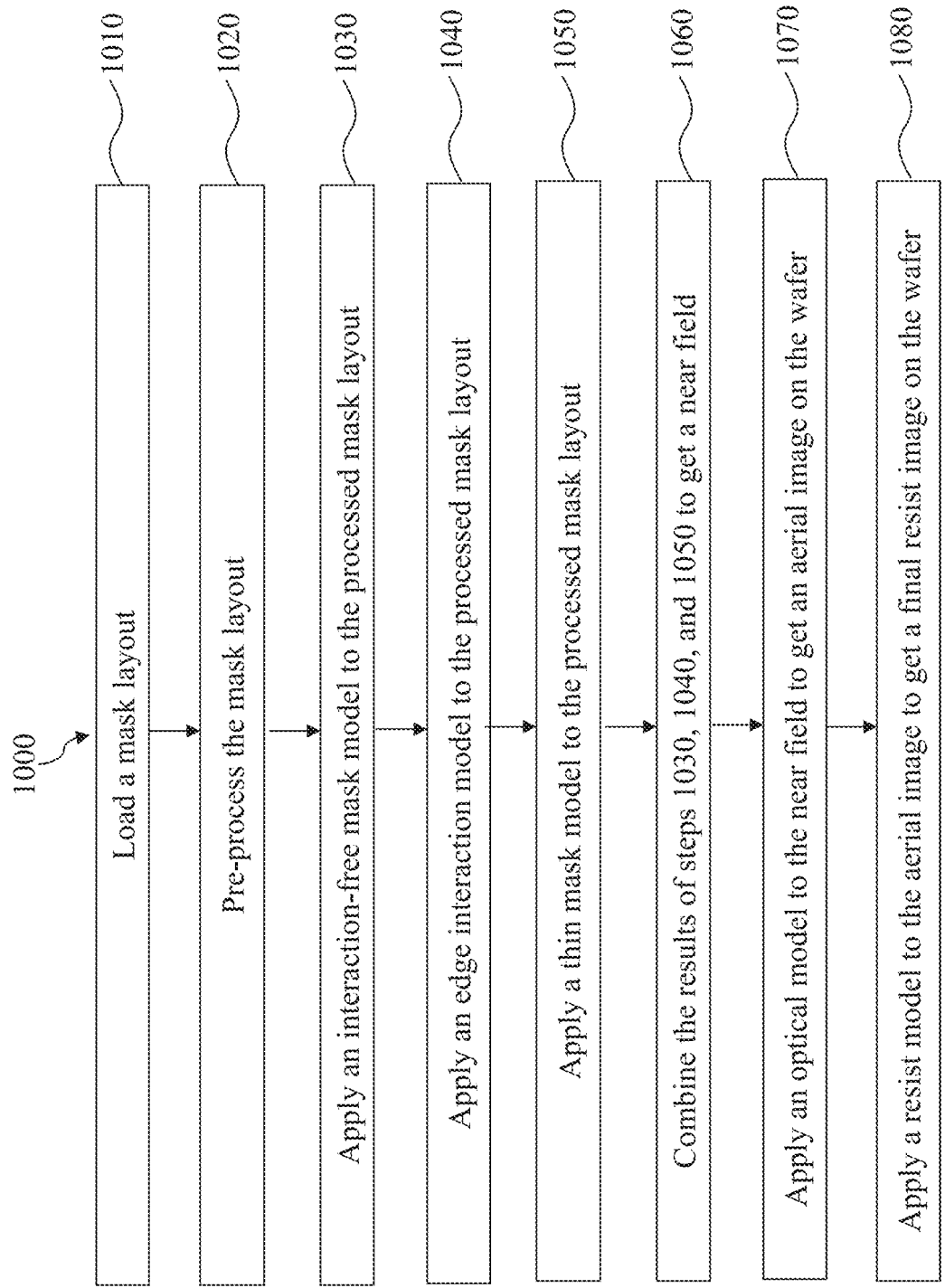
FIG. 13 is a flowchart of a method illustrating a process flow according to various aspects of the present disclosure.

FIG. 13 is a flowchart of a method 1000 that illustrates an overall flow of an embodiment of the present disclosure.

The method 1000 includes a step 1010, in which a mask layout is loaded. The mask layout may be for an ILT mask, which as discussed above may contain mask patterns having non-Manhattan geometries. For example, the mask layout loaded herein may include mask patterns having curvilinear pattern edges.

The method 1000 includes a step 1020, in which the mask layout loaded in step 1010 undergoes pre-processing. In some embodiments, the pre-processing may include steps such as rasterization and/or anti-aliasing filtering discussed above with reference to the step 320 in FIG. 4.

The method 1000 includes a step 1030, in which an interaction-free mask model is applied to the mask layout processed from step 1020. The interaction-free mask model may refer to mask models that do not yet have the edge interaction taken into account. In some embodiments, the interaction-free mask model is obtained by using the two-dimensional kernels discussed above with reference to FIGS. 3-11.

The method 1000 includes a step 1040, in which an edge interaction model according to the present disclosure is applied to the mask layout processed from step 1020. The details of step 1040 will also be discussed in greater detail below.

The method 1000 includes a step 1050, in which a thin mask model is applied to the mask layout processed from step 1020. In embodiments where the step 1030 has obtained the interaction-free mask model by using the two-dimensional kernels discussed above with reference to FIGS. 3-11, the step 1050 may be omitted herein, because it would have already been performed as a part of the step 1030.

The method 1000 includes a step 1060, in which the results from steps 1030, 1040, and 1050 are all combined to obtain a near field for the mask layout.

The method 1000 includes a step 1070, in which an optical model is applied to the near field (obtained in step 1060) to obtain an aerial image of the mask layout on a wafer. The step 1070 may also be viewed as performing an exposure simulation.

The method 1000 includes a step 1080, in which a photoresist model is applied to the aerial image to obtain a final photoresist image of the mask layout on the wafer. The step 1080 may also be viewed as performing a photoresist simulation.

Figure 14:
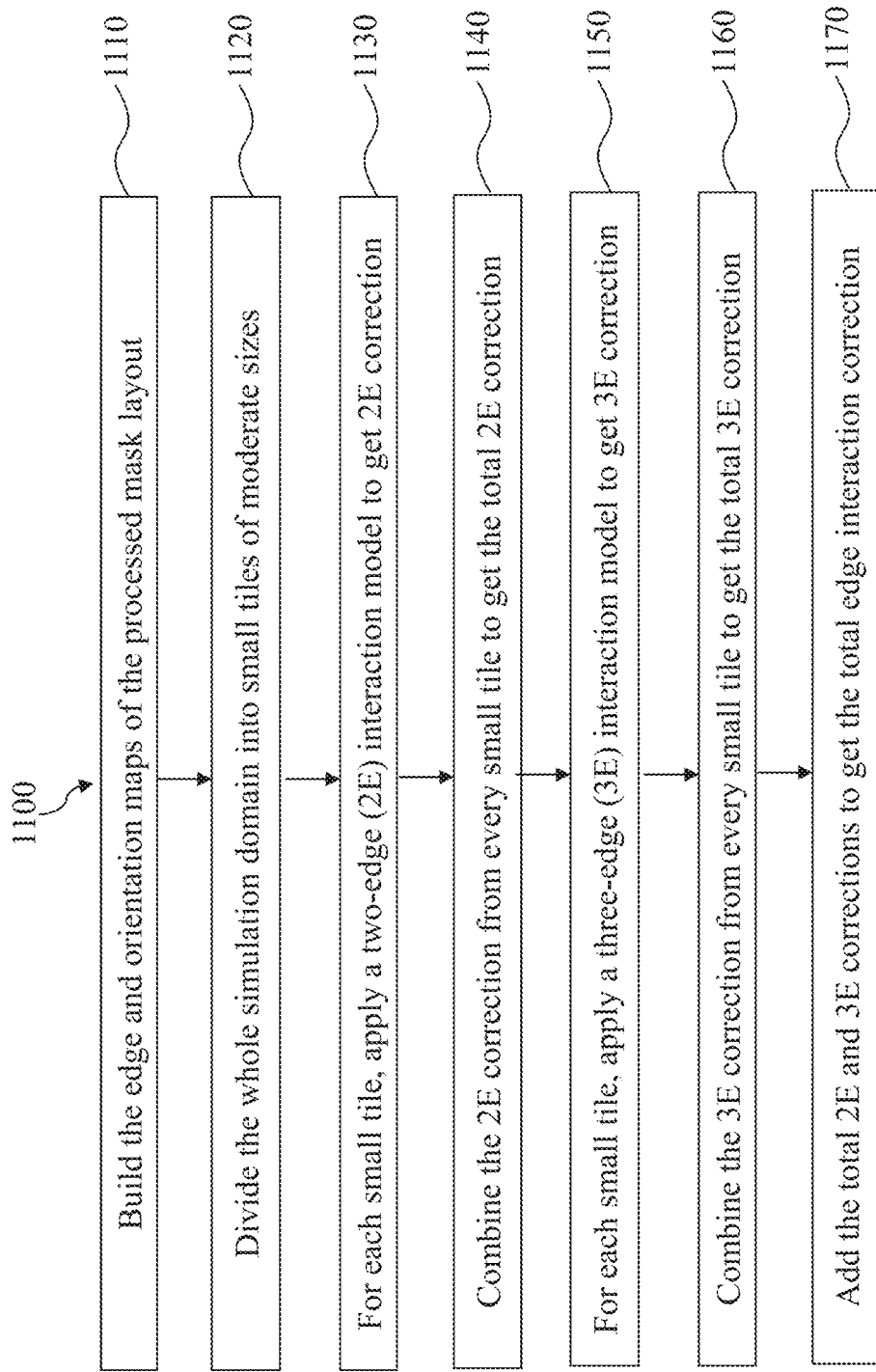
FIG. 14 is a flowchart of a method of determining edge interactions according to various aspects of the present disclosure.

Referring now to FIG. 14, a flowchart of a method 1100 of performing the step 1040 of FIG. 13 is illustrated. The method 1100 includes a step 1110, in which the edge and orientation maps of the processed mask layout are built. Again, this step 1110 may apply the same method that is employed by the two-dimensional kernels discussed above with reference to FIGS. 3-11, so that non-Manhattan patterns with arbitrary angles can be accurately modeled.

The method 1100 includes a step 1120, in which a whole simulation domain (e.g., a mask layout where the edge interaction effect needs to be determined) is divided into small tiles of moderate sizes. For example, a side of the tile may have a dimension in a range from 20 nm to 100 nm. The reason for the small tiles is because the edge interaction will come into play at small distances, which can be accounted for within a small tile. Therefore, larger tiles are not needed to account for the edge interaction. Note that if an edge crosses over two tiles (i.e., each tile contains a segment of the edge), then that edge may be calculated twice in some embodiments.

The method 1100 includes a step 1130, in which a two-edge (2E) interaction model is applied for each of the small tiles generated in step 1120 to get the two-edge correction results. In other words, within each of the small tiles, the various possible pairs of edges are identified, and the edge interaction between each possible pair of edges is calculated.

The method 1100 includes a step 1140, in which the two-edge interaction results from every small tile are combined to determine the total two-edge interaction correction results for the pattern as a whole.

The method 1100 includes a step 1150, in which a three-edge (3E) interaction model is applied for each of the small tiles generated in step 1120 to get the three-edge correction results. In other words, the step 1150 is similar to step 1130, except that it is performed with various combinations of three edges rather than two edges.

The method 1100 includes a step 1160, in which the three-edge interaction results from every small tile are combined to determine the total three-edge interaction correction results for the pattern as a whole. In other words, the step 1160 is similar to step 1140, except that it is performed with various combinations of three edges rather than two edges.

The method 1100 includes a step 1170, in which the total two-edge interaction correction results from step 1140 and the total three-edge interaction correction results from step 1160 are combined to determine the total edge interaction correction results. It is understood that in theory, steps similar to steps 1130-1140 may be repeated for the cases of four-edge interactions, five-edge interactions, and so on. In reality, however, two-edge and three-edge interactions may be sufficient to determine the edge interaction correction with sufficient accuracy.

Figure 15:
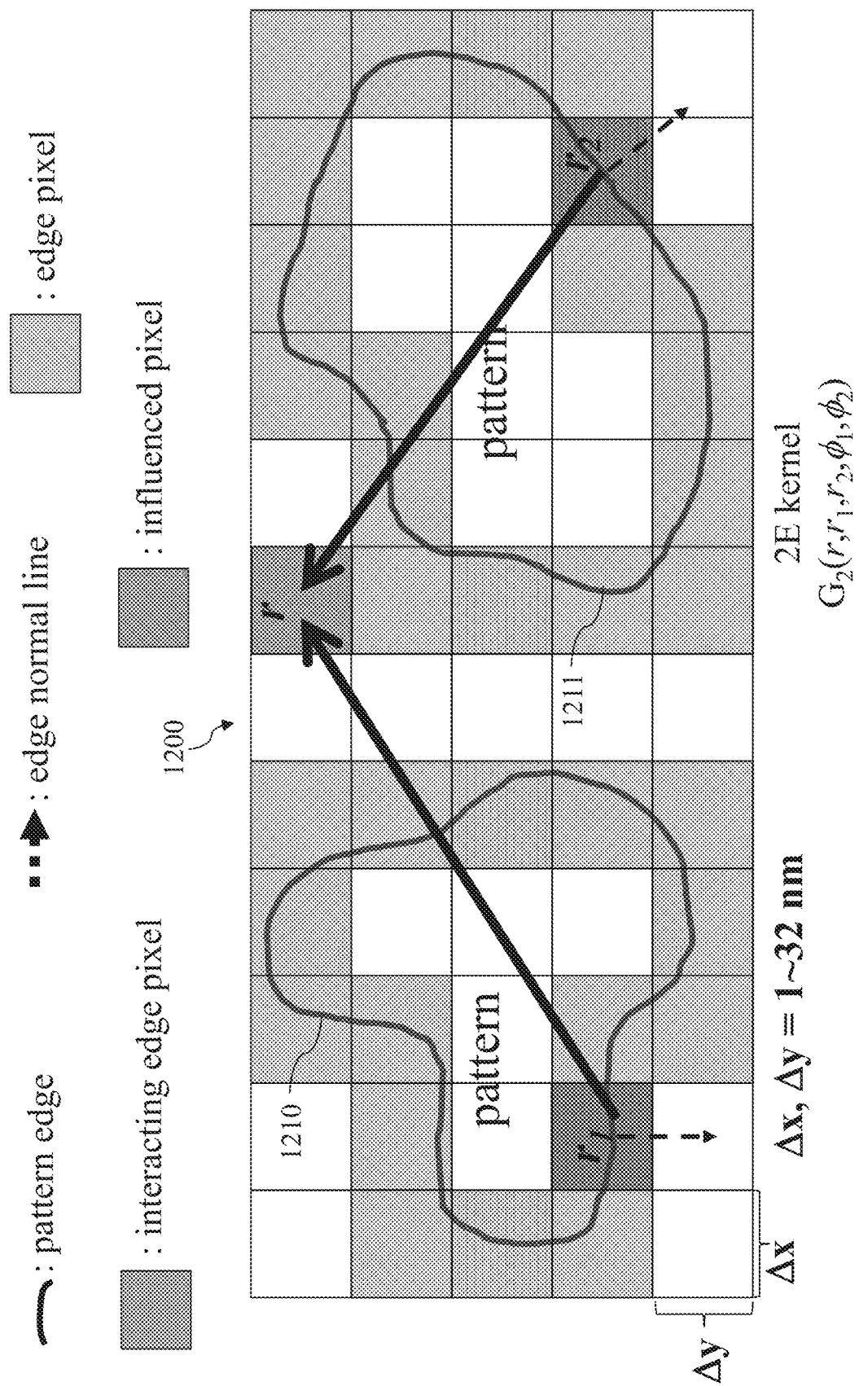
FIG. 15 is a graphical illustration of how a two-edge (2E) kernel works according to various aspects of the present disclosure.

The steps 1130-1140 are now discussed in more detail with reference to FIG. 15, which is a graphical illustration of how a two-edge (2E) kernel is defined. FIG. 15 illustrates a tile 1200, which is an example of one of the small tiles obtained by dividing the simulation domain. In other words, the tile 1200 represents an example portion of a mask layout that needs to be modeled to take into account of the edge interaction effect discussed above. The tile 1200 is displayed as a grid of pixels, where each pixel has an X-axis dimension $\Delta x$ and a Y-axis dimension $\Delta y$. In some embodiments, $\Delta x$ and $\Delta y$ are each in a range from 1 nanometer (nm) to 32 nm.

The tile 1200 includes a non-Manhattan pattern 1210 and a non-Manhattan pattern 1211. Similar to the non-Manhattan pattern 400 discussed above, the non-Manhattan patterns 1210-1211 each include curvilinear edges. Of course, these patterns 1210-1211 shown herein are merely examples, and that other patterns such as Manhattan patterns may be included in the tile in other embodiments. In order to determine the edge interaction model in step 1040 discussed above, the patterns 1210-1211 are considered in terms of pixels rather than geometry. For example, for any given pixel (not necessarily an edge pixel), such as pixel r, it is influenced by the edge interaction from any two edge pixels, such as pixels $r_1$ and $r_2$, that are each located on an edge of one of the patterns 1210-1211. The pixels $r_1$ and $r_2$ may also be referred to as interacting edge pixels, and the pixel r may also be referred to as an influenced pixel. Of course, the pixel r may experience edge interaction influences from any other possible combination of two edge pixels (not just $r_1$ and $r_2$), and $r_1$ and $r_2$ may also influence other pixels (not just r). In some embodiments, the pixels $r_1$ and $r_2$ are located within a predefined proximity or distance of each other, for example within N nanometers, where N may be in a range from about 1 nm to about 100 nm. As discussed above with reference to FIG. 5, the edge pixels may be determined by taking the gradient. The edge pixels $r_1$ and $r_2$ also have orientation angles $\varphi_1$ and $\varphi_2$, respectively, which as discussed above may be obtained by taken the normal line or normal vector at the edge segment in the pixel. The normal lines for the pixel $r_1$ and $r_2$ have been graphically illustrated in FIG. 15 as arrows with dotted lines pointing away from the edges.

Based on the influence exerted to the pixel r by the pair of edge pixels $r_1$ and $r_2$, a two-edge interaction kernel $G_2$ is defined. The kernel $G_2$ describes the near field correction at the pixel r due to the interaction between the two edge pixels edge pixels $r_1$ and $r_2$. The kernel $G_2$ may be expressed as $G_2(r, r_1, r_2, \varphi_1, \varphi_2)$, in other words, the kernel $G_2$ is a function of r, $r_1$, $r_2$, $\varphi_1$, $\varphi_2$. It is understood that r, $r_1$, $r_2$ are two-dimensional position vectors herein. For example, r, $r_1$, and $r_2$ may each be represented in a polar coordinate system and as such may include a radial coordinate and angular coordinate. The radial and angular coordinates are determined based on the location of their respective pixels relative to the origin of the simulated tile.

Thus, for any given influenced pixel (such as the pixel r), a respective two-edge kernel may be determined for any possible pair of two interacting edges (such as the edges located in pixels $r_1$ and $r_2$). In the end, an integral or a summation is taken for all these two-edge kernels to obtain the true near field correction at the influenced pixel r. This process may also be repeated for each pixel in the tile 1200. This will yield the two-edge correction field (based on the interaction of two-edges) as the result of step 1140 of FIG. 14 discussed above.

Figure 16:
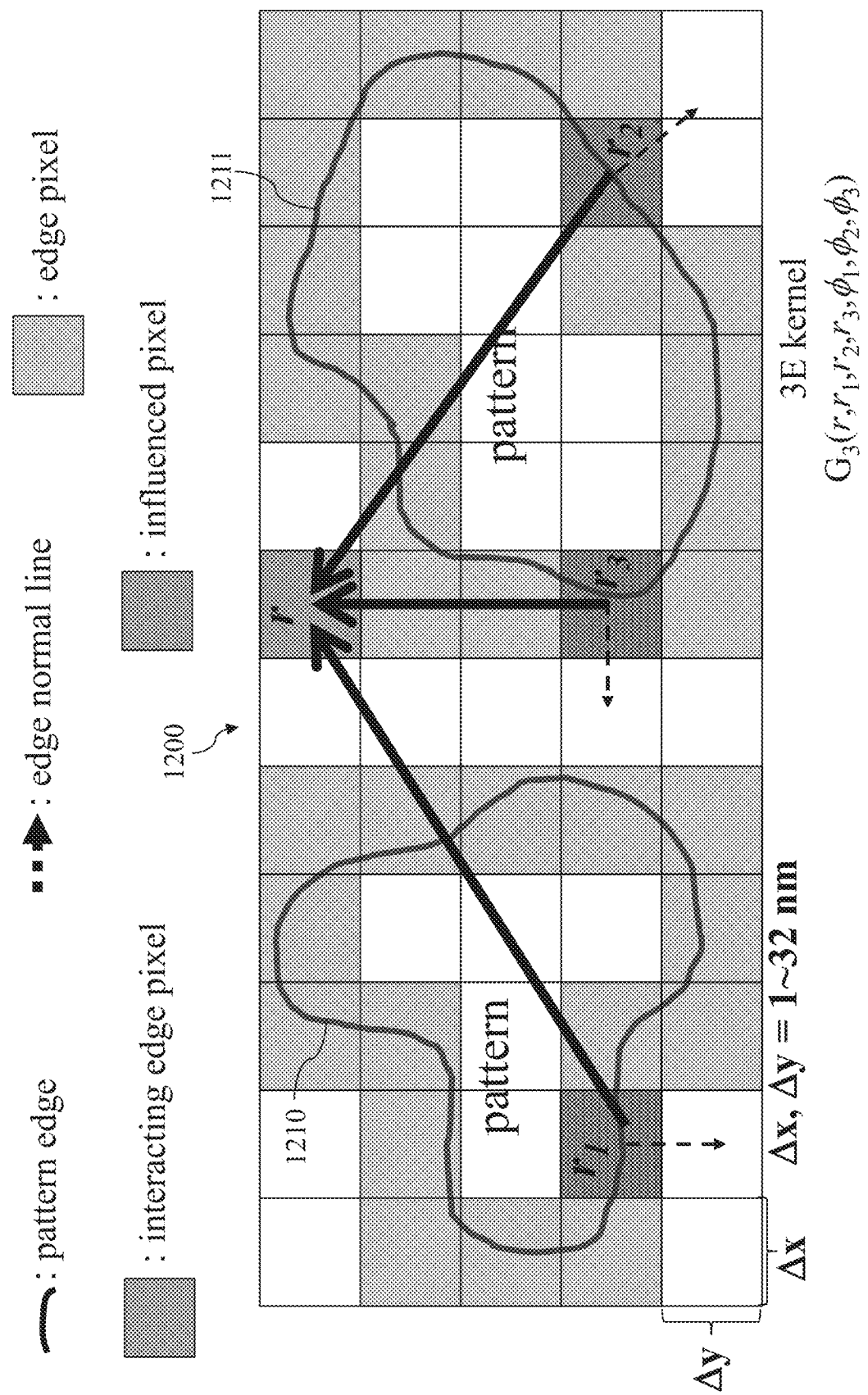
FIG. 16 is a graphical illustration of how a three-edge (3E) kernel works according to various aspects of the present disclosure.

The steps 1150-1160 are now discussed in more detail with reference to FIG. 16, which is a graphical illustration of how a three-edge kernel is determined. FIG. 16 and FIG. 15 share many similarities. For example, they both illustrate a tile 1200 in which non-Manhattan patterns 1210 and 1211 are included. However, FIG. 16 illustrates how the pixel r is influenced by a combination of three edges $r_1$, $r_2$, and $r_3$. Otherwise, the process to determine the edge interaction in FIG. 16 is similar to that discussed above in association with FIG. 15. Accordingly, a three-edge kernel $G_3$ can be determined as a function of r, $r_1$, $r_2$, $r_3$, $\varphi_1$, $\varphi_2$, $\varphi_3$. Again, r, $r_1$, $r_2$, and $r_3$ are two-dimensional position vectors, for example they may be represented in a polar coordinate system that each have a radial coordinate and an angular coordinate, depending on the locations of their respective pixels relative to the origin of the simulated tile. The orientation angles $\varphi_1$, $\varphi_2$, and $\varphi_3$ are determined by taking the normal lines of the edge in the respective pixels. As is the case for the two-edge kernel $G_2$ in FIG. 15, the three-edge kernel $G_3$ in FIG. 16 can be integrated or summed up with respect to all possible combinations of three edges, and for each influenced pixel. This will yield the three-edge correction model for step 1160.

With the results of both the two-edge correction model and the three-edge correction model, they may be combined to generate the edge correction field for the tile 1200. Again, theoretically the above process may be repeated for a four-edge correction model, five-edge correction model, etc., but that may be reaching a point of diminishing returns, since a two-edge correction model and a three-edge correction model may be sufficient to approximate the overall edge correction model accurately.

Figure 17:
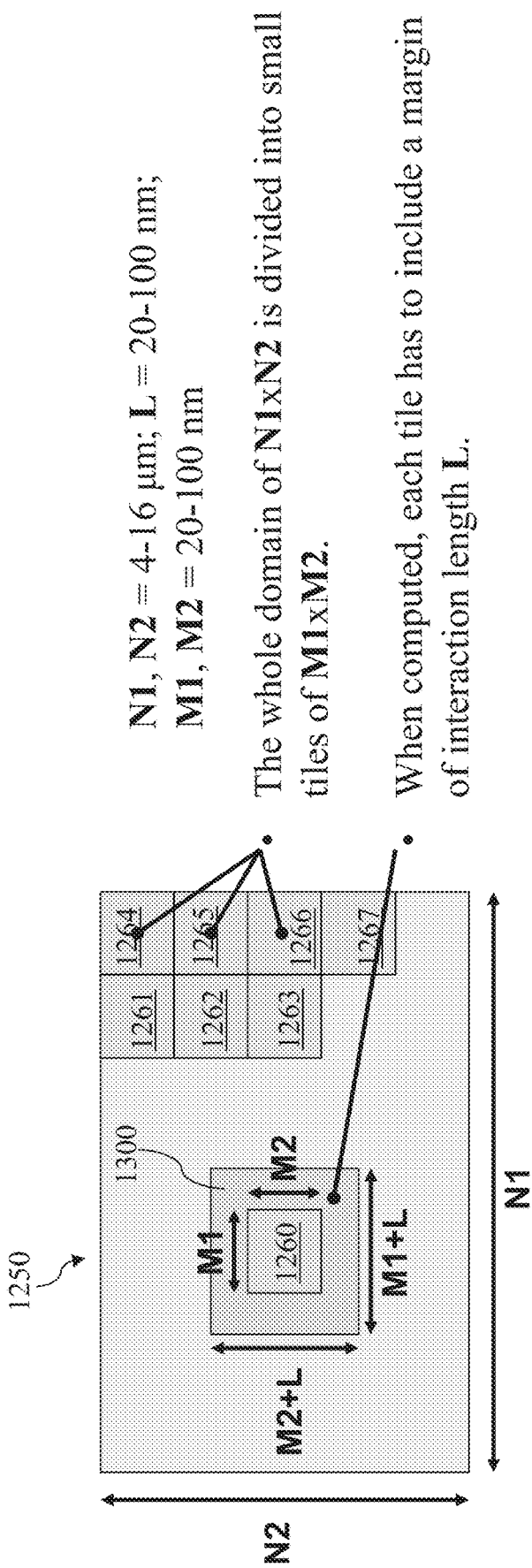
FIG. 17 illustrates two techniques for accelerating the computations of the edge interaction according to various aspects of the present disclosure.

FIG. 17 illustrates two techniques for accelerating the kernel computations discussed above. The first technique is dividing the simulation domain into smaller tiles to perform the kernel computations. A simulation domain 1250 is illustrated in FIG. 17. The simulation domain 1250 may include one or more mask patterns (which may be non-Manhattan patterns) for which the edge interaction needs to be determined. The simulation domain 1250 in the illustrated embodiment resembles a rectangle and includes a first dimension of size N1 and a second dimension of size N2. In some embodiments, N1 and N2 are each in a range between 4 microns and 16 microns.

If the two-edge kernel or three-edge kernel computations discussed above are performed on the simulation domain 1250, it may take too long due to the relatively large size of the simulation domain. Thus, as discussed above in FIGS. 15-16, the simulation domain 1250 is divided into a plurality of smaller tiles in order to speed up the calculations. Some of the tiles are illustrated herein as tiles 1260-1267. Limiting computations within the tiles should not affect the final result of the whole edge interaction field since edges outside of a given tile may be too far to exert influence on pixels within that tile anyway.

The tiles 1260-1267 have dimensions of M1×M2. In some embodiments, M1 and M2 are each in a range between 20 nm and 100 nm. However, during the edge kernel computations, each tile also includes a margin of interaction 1300. Without adding the margin of interaction, an implicit assumption is made that the tiles have periodic boundary conditions, which is a false assumption. Accordingly, the kernel computations performed without taking the margin of interaction 1300 into account would have yield incorrect results. Thus, the present disclosure surrounds each tile with a respective margin of interaction 1300. The kernel computations discussed above with reference to FIGS. 15-16 are performed within the margin of interaction 1300 (including the tile that is surrounded therein) to ensure that the results are accurate. Thereafter, only the kernel computation results attributed to the tile itself are kept, whereas the kernel computation results attributed to the margin of interaction (but that are outside of the tile itself) are discarded. As is shown in FIG. 17, the margin of interaction 1300 has a length L on each side. In some embodiments, L is in a range between 20 nm and 100 nm. In some embodiments, M1=M2=L in order to optimize the speed of calculations.

The second technique for speeding up the computations involves exploiting the translational and rotational symmetries to decompose the edge-interaction kernels $G_2$, $G_3$, etc. For example, the two-edge kernel $G_2$ may be decomposed according to the following equation:

$$G_2(r, r_1, r_2, \varphi_1, \varphi_2) = \sum_{l_1, l_2} e^{-i l_1 \varphi_1} e^{-i l_2 \varphi_2} G_2^{(l_1 l_2)}(r - r_1, r - r_2)$$

where $l_1$ and $l_2$ represent the index obtained after a Fourier series expansion performed due to a periodicity of the $G_2$ function (e.g., $G_2$ is periodic with respect to $\varphi_1$ and $\varphi_2$). Technically, $l_1$ and $l_2$ each vary from −∞ to +∞. Practically though, only a few numbers of $l_1$ and $l_2$ are needed (such as 0, 1, 2, or alternatively −1, 0, and 1) to obtain a sufficiently accurate approximation of $G_2$. Note that due to the translational symmetry, only the relative positions between r and $r_1$ (and likewise between r and $r_2$) matter (as opposed to knowing the absolute positions for r, $r_1$, and $r_2$) for purposes of decomposing the two-edge kernel $G_2$, which helps simplify the computations. Again, the $G_2$ herein describes the correction field for any given influenced pixel r due to the edge interaction between two edge pixels $r_1$ and $r_2$. The three-edge kernel $G_3$ may be obtained in a similar fashion.

FIG. 18 is a graphical illustration of how to use the edge-kernels to perform an edge correction process according to an example of the present disclosure. As an example, the two-edge kernel $G_2$ is used herein. However, the following discussions apply to the three-edge kernel $G_3$ as well.

The first step of this process is to compute the edge and orientation maps of a pattern. The pattern may be a non-Manhattan pattern, such as the pattern 400 discussed above (or the patterns 1210-1211 discussed above). The edge (e.g., the edge pixels) of the pattern is computed by obtaining the gradient of the pattern 400, where the gradient may include a magnitude and is expressed as |grad(x,y)|. As discussed above, the orientation map refers to the angle associated with the normal line/vector for each edge pixel. In other words, for each of the edge pixels, the normal line/vector has a corresponding angle or orientation, and the angle/orientation for all the edge pixels collectively may be considered an orientation map. For the sake of simplicity, the orientation map is mathematically expressed herein as $\varphi(x,y)$.

The second step of this process is to compute the mask rotation components $Q_l$ for the interested l's. This is mathematically expressed as: $Q_l(x,y)=|grad(x,y)| \times exp[-i \; l \; \varphi(x,y)]$, where $Q_l(x,y)$ represents the mask rotation components. Again, although the term l may vary from negative infinity to infinity, the practical computations herein may only select a few interested l's (e.g., 1, 2, 3) to simplify the computations.

The third step of this process shown in FIG. 18 is to compute the two-edge correction. The following equation is used for this computation:

$$\Delta m_{2E}(r) = \sum_{l_1, l_2} \int \int Q_{l_1}(r_1) Q_{l_2}(r_2) G_2^{(l_1 l_2)}(r-r_1, r-r_2) dr_1 dr_2$$

where $\Delta m_{2E}(r)$ represents the two-edge correction, where r, $r_1$, and $r_2$ are two-dimensional spatial position vectors, and where both $l_1$ and $l_2$ loop over all interested l's. In other words, $\Delta m_{2E}(r)$ describes the correction field obtained for any given influenced pixel r due to all the possible combinations of two edge pixels (because of the integrals in $\Delta m_{2E}(r)$). As r varies, then the calculated correction field $\Delta m_{2E}(r)$ varies as well, since the correction field $\Delta m_{2E}(r)$ is a function of the influenced pixel r. Once $\Delta m_{2E}(r)$ is calculated for all possible r's, the overall edge correction field can be determined by combining the results of the correction field associated with all the individual influenced pixels r.

Figure 19:
FIG. 19 is a flowchart illustrating a method of obtaining the two-dimensional edge interaction kernels according to various aspects of the present disclosure.

FIG. 19 is a flowchart illustrating a method 1500 of obtaining the two-dimensional kernels discussed herein. The method 1500 includes a step 1510, in which calibration mask layout pattern samples are generated. In some embodiments, there may be hundreds of calibration mask layout patterns.

The method 1500 includes a step 1520, in which the mask layout undergoes preprocessing, for example rasterization and anti-aliasing filtering.

The method 1500 includes a step 1530, in which the thin mask model is applied to each of the pre-processed mask patterns.

The method 1500 includes a step 1540, in which the edge-interaction-free model is applied to each processed mask layout. This step computes the edge correction without considering the edge interaction.

The method 1500 includes a step 1550, in which the rigorous near field of each processed mask layout is computed. This may be a computationally intensive process and as such may not be suitable in an actual production environment. However, since the method 1500 is directed to a calibration environment, the fact that step 1550 is computationally intensive may be irrelevant.

The method 1500 includes a step 1560, in which a difference is computed. The difference is between the results from step 1550 (i.e., the rigorous near field computations) and the results of steps 1530 and 1540 (i.e., the thin mask model and the interaction-free mask model). In other words, the results of steps 1530 and 1540 are each subtracted from the results of step 1550, and that will yield the result of step 1560. The result of step 1560 is the "residue" left by the edge interaction.

The method 1500 includes a step 1570, in which the edge distribution and orientation maps are built for each of the processed calibration mask layout patterns.

The method 1500 includes a step 1580, in which the near field difference against the maps undergoes regression analysis to get the kernels. As a part of the regression analysis, a plurality of coefficients may be solved. The step 1580 may produce a library that can be re-used later to generate the two-dimensional kernels. These two-dimensional kernels can be used for different masks too.

FIG. 20 illustrates some computational details involved in performing the step 1580 (e.g., the regression analysis) discussed above with reference to FIG. 19. First, the computational results obtained from step 1560 discussed above is represented using the following equation:

$$\Delta m_{2E}(r) = \sum_{l_1, l_2} \int \int Q_{l_1}(r_1) Q_{l_2}(r_2) G_2^{(l_1 l_2)}(r-r_1, r-r_2) dr_1 dr_2$$

where $Q_{l_1}(r_1)$ and $Q_{l_2}(r_2)$ are the mask rotation components obtained from the computational results of step 1570 discussed above.

A Fast Fourier Transform (FFT) is performed to the above equation to obtain the following equation:

$$\Delta \tilde{m}_{2E}(k) = \sum_{l_1, l_2} \sum_{k_1} \tilde{Q}_{l_1}(k_1) \tilde{Q}_{l_2}(k-k_1) \tilde{G}_2^{(l_1 l_2)}(k_1, k-k_1)$$

With a small interaction tile, the total number of the grid points of k's and $k_1$'s over the two-dimensional frequency space should be moderate. For example, the number of distinct spatial frequencies is 100 on a two-dimensional simulation domain of 50 nm×50 nm with 5-nm grid size. It is understood that if an M number of layout samples are employed in step 1510 discussed above, then there will be an M number of equations for each k. For each pattern, $Q_l$ can be computed with the edge and orientation maps computed in step 1570, so there are a number of linear equation sets to solve for the unknown two-dimensional kernels $G_2$'s. With a large enough M, a linear regression method can be applied to solving for $G_2$'s at every $(k_1, k-k_1)$ for every $l_1$ and $l_2$.

Figure 21:
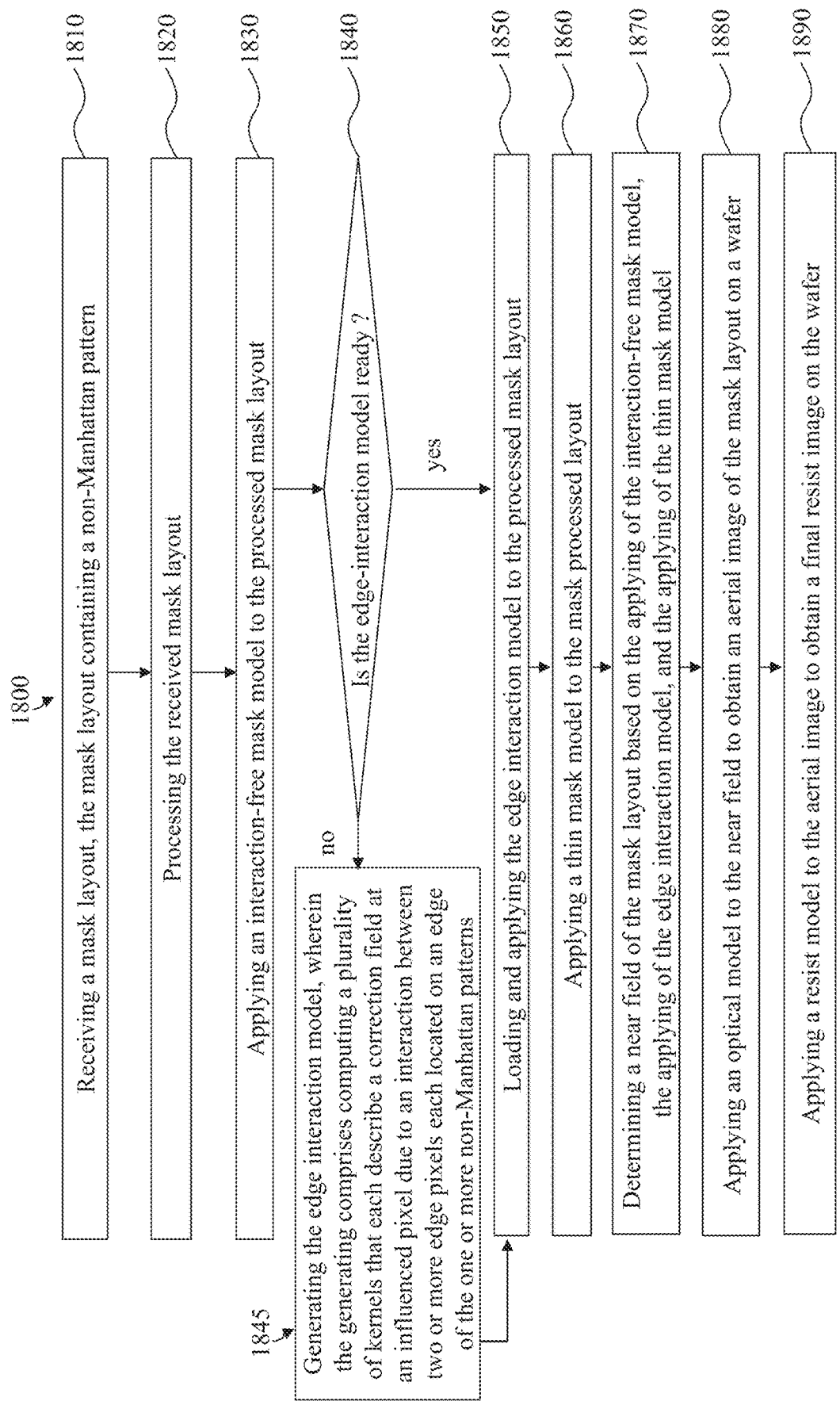
FIG. 21 is a flowchart illustrating a method of modeling a mask according to various aspects of the present disclosure.

FIG. 21 illustrates a method 1800 of modeling a mask according to an embodiment of the present disclosure. The method 1800 includes a step 1810 of receiving a mask layout. The mask layout includes one or more non-Manhattan patterns.

The method 1800 includes a step 1820 of processing the received mask layout. In some embodiments, the step 1820 may include performing rasterization or anti-aliasing filtering on the mask layout.

The method 1800 includes a step 1830 of applying an interaction-free mask model to the processed mask layout. In some embodiments, the interaction-free mask model may be obtained by performing the methods discussed above with reference to FIGS. 3-11 using the two-dimensional kernels.

The method 1800 includes a step 1840 of checking whether the edge interaction kernels have been generated. If not, the edge interaction kernels will be generated by step 1845 that calls the method 1500. The step 1845 comprises computing a plurality of kernels that each describe a correction field at an influenced pixel due to an interaction between two or more edge pixels each located on an edge of the one or more non-Manhattan patterns. In some embodiments, the computing the plurality of kernels comprises computing each of the kernels as a function of: a location of the influenced pixel, a respective location of each of the two or more edge pixels, and a respective orientation angle associated with each of the two or more edge pixels.

The method 1800 includes a step 1850 of applying the edge interaction model to the processed mask layout. In some embodiments, the applying the edge interaction model comprises: dividing the mask layout into a plurality of tiles, the tiles each being surrounded by a margin of interaction length; computing the edge interaction correction field for each of the tiles; and determining the total edge interaction correction field for the mask layout by combining the edge interaction correction field from each tile.

The method 1800 includes a step 1860 of applying a thin mask model to the mask processed layout.

The method 1800 includes a step 1870 of determining a near field of the mask layout based on the applying of the interaction-free mask model, the applying of the edge interaction model, and the applying of the thin mask model.

The method 1800 includes a step 1880 of applying an optical model to the near field to obtain an aerial image of the mask layout on a wafer.

The method 1800 includes a step 1890 of applying a resist model to the aerial image to obtain a final resist image on the wafer.

It is understood that although the method 1800 is performed to a mask layout having a non-Manhattan pattern as an example, the method 1800 may be applied to mask layouts having Manhattan patterns too. In addition, additional steps may be performed before, during, or after the steps 1810-1890 herein. For example, the additional steps may include manufacturing a mask, and/or performing semiconductor fabrication using the mask. For reasons of simplicity, these additional steps are not discussed in detail herein.

One aspect of the present disclosure involves a method. A mask layout is received. A set of two-dimensional kernels is generated based on a set of pre-selected mask layout samples. The set of two-dimensional kernels is applied to the received mask layout to obtain a correction field. A near field of the received mask layout is determined based at least in part on the correction field.

Another aspect of the present disclosure involves a method. A mask layout is received. The received mask layout contains a non-Manhattan pattern. A plurality of two-dimensional kernels is generated based on a set of pre-selected mask layout samples. The two-dimensional kernels each have a respective rotational symmetry. The two-dimensional kernels are applied to all the edges of the non-Manhattan pattern to obtain a correction field for the non-Manhattan pattern. A near field of the non-Manhattan pattern is determined based at least in part on the correction field.

Yet another aspect of the present disclosure involves a method. A mask layout that contains a non-Manhattan pattern is received. The received mask layout is processed. An edge of the non-Manhattan pattern and the orientation are identified. A plurality of two-dimensional kernels is generated based on a set of processed pre-selected mask layout samples. The two-dimensional kernels each have a respective rotational symmetry. The two-dimensional kernels are applied to all the edges of the non-Manhattan pattern to obtain a correction field for the non-Manhattan pattern. A thin mask model is applied to the non-Manhattan pattern. The thin mask model contains a binary modeling of the non-Manhattan pattern. A near field of the non-Manhattan pattern is determined by applying the correction field to the non-Manhattan pattern having the thin mask model applied thereon. An optical model is applied to the near field to obtain an aerial image on a wafer. A resist model is applied to the aerial image to obtain a final resist image on the wafer.

Another aspect of the present disclosure involves a method. A mask layout is received. An interaction-free mask model is applied to the mask layout. An edge interaction model is applied to the mask layout. The edge interaction model describes the influence due to a plurality of combinations of two or more edges interacting with one another. A thin mask model is applied to the mask layout. A near field is determined based on the applying of the interaction-free mask model, the applying of the edge interaction model, and the applying of the thin mask model.

Yet another aspect of the present disclosure involves a method. A mask layout is received. The received mask layout includes one or more non-Manhattan patterns. An interaction-free mask model is applied to the received mask layout. An edge interaction model is generated based on a set of pre-selected mask layout samples. The edge interaction model computes the influence exerted to a plurality of pixels of the mask layout by a plurality of combinations of two or more edge segments of the one or more non-Manhattan patterns. The edge interaction model is applied to the received mask layout. A thin mask model is applied to the received mask layout. A near field of the received mask layout is determined based on the applying of the interaction-free mask model, the applying of the edge interaction model, and the applying of the thin mask model.

One more aspect of the present disclosure involves a method. A mask layout is received. The received mask layout includes one or more non-Manhattan patterns. The received mask layout is processed. An interaction-free mask model is applied to the processed received mask layout. An edge interaction model is generated based on a set of pre-selected mask layout samples. The generating comprises computing a plurality of kernels that each describe a correction field at an influenced pixel due to an interaction between two or more edge pixels each located on an edge of the one or more non-Manhattan patterns. The edge interaction model is applied to the processed received mask layout. A thin mask model is applied to the processed received mask layout. A near field of the received mask layout is determined based on the applying of the interaction-free mask model, the applying of the edge interaction model, and the applying of the thin mask model. An optical model is applied to the near field to obtain an aerial image of the received mask layout on a wafer. A resist model is applied to the aerial image to obtain a final resist image on the wafer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
dividing a mask layout into a plurality of tiles;
generating, for each of the tiles, an edge correction result by applying a two-edge interaction model and a three-edge interaction model to each of the tiles, wherein the applying the two-edge interaction model and the three-edge interaction model includes:
identifying different sets of edges located within each of the tiles, wherein each set of the edges corresponds to a predefined number of edges; and
calculating an interaction between the edges within each set of edges;
generating a total edge correction result by combining, from all of the tiles, a total two-edge correction result obtained by applying the two-edge interaction model and a total three-edge correction result obtained by applying the three-edge interaction model; and
applying the total edge correction result to the mask layout.

2. The method of claim 1, further comprising: applying an interaction-free mask model to the mask layout.

3. The method of claim 2, further comprising: obtaining the interaction-free mask model using multi-dimensional kernels.

4. The method of claim 2, further comprising: applying a thin mask model to the mask layout.

5. The method of claim 4, wherein the applying a thin mask model comprises assigning a first constant field value to first areas occupied by patterns on the mask layout and assigning a second constant field value to second areas not occupied by the patterns on the mask layout.

6. The method of claim 4, further comprising: obtaining a near field for the mask layout by combining a first result of the applying the interaction-free mask model, a second result of the applying the two-edge interaction model and the three-edge interaction model, and a third result of the applying the thin mask model.

7. The method of claim 6, further comprising: obtaining an aerial image of the mask layout on a wafer by applying an optical model to the near field.

8. The method of claim 7, further comprising: obtaining a resist image on the wafer by applying a resist model to the aerial image.

9. The method of claim 1, wherein the dividing comprises dividing the mask layout into the plurality of tiles that each have a side having a dimension in a range between about 20 nanometers and about 100 nanometers, wherein each of the tiles include a grid of pixels.

10. The method of claim 1, further comprising: processing the mask layout using rasterization or anti-aliasing filtering, wherein the dividing of the mask layout and the applying the two-edge interaction model and the three-edge interaction model are performed to the processed mask layout.

11. A method, comprising:
dividing a mask layout into a plurality of tiles;
applying a two-edge interaction model to each of the tiles to obtain a two-edge correction result for each tile, including identifying possible pairs of edges within each tile and calculating a respective two-edge correction result between each possible pair of edges;
combining the two-edge correction result obtained from all the tiles to obtain a total two-edge correction result;
applying a three-edge interaction model to each of the tiles to obtain a three-edge correction result for each tile, identifying possible combinations of three edges within each tile and calculating a respective three-edge correction result between each possible combination of three edges;
combining the three-edge correction result obtained from all the tiles to obtain a total three-edge correction result;
adding the total two-edge correction result and the total three-edge correction result to obtain a total edge interaction result;
and
applying the total edge interaction result to the mask layout.

12. The method of claim 11, further comprising:
applying an interaction-free mask model to the mask layout, wherein the interaction-free mask model is generated using two-dimensional kernels; and
applying a thin mask model to the mask layout, wherein the thin mask model assigns two different constant field values to areas occupied or not occupied by patterns on the mask layout, respectively.

13. The method of claim 12, wherein:
the applying the interaction-free mask model generates a first result;
the applying the applying the two-edge interaction model and the applying the three-edge interaction model collectively generates a second result;
the applying the thin mask model generates a third result; and
the method further comprises obtaining a near field for the mask layout based on the first result, the second result, and the third result.

14. The method of claim 13, further comprising:
generating an aerial image of the mask layout on a wafer by applying an optical model to the near field; and
generating a resist image on the wafer by applying a resist model to the aerial image.

15. The method of claim 11, further comprising:
before the dividing, receiving the mask layout, wherein the mask layout includes one or more non-Manhattan patterns; and
processing the mask layout using rasterization or anti-aliasing filtering, wherein the dividing of the mask layout, the applying the two-edge interaction model, and the applying the three-edge interaction model are performed to the processed mask layout.

16. A method, comprising:
receiving a mask layout that contains non-Manhattan patterns;
processing the mask layout using rasterization or anti-aliasing filtering techniques;
dividing a processed mask layout into a plurality of tiles;
generating, for each of the tiles, a two-edge correction result and a three-edge correction result by applying a two-edge interaction model and a three-edge interaction model to said tile, respectively, wherein the applying the two-edge interaction model and the applying the three-edge interaction model each includes:
identifying different sets of edges located within each of the tiles, wherein each set of the edges corresponds to a predefined number of edges; and
calculating an interaction between the edges within each set of edges;
generating a total edge correction result by combining, from the plurality of tiles, a total two-edge correction result obtained by applying the two-edge interaction model and a total three-edge correction result obtained by applying the three-edge interaction model;
applying the total edge correction result to the processed mask layout;
obtaining a near field based at least in part on a result of the applying the edge interaction model;
obtaining an aerial image on a wafer by applying an optical model to the near field; and
obtaining a resist image on the wafer by applying a resist model to the aerial image.

17. The method of claim 16, further comprising:
applying an interaction-free mask model to the mask layout, wherein the interaction-free mask model is generated using two-dimensional kernels; and
applying a thin mask model to the mask layout, wherein the thin mask model assigns two different constant field values to areas occupied or not occupied by patterns on the mask layout, respectively;
wherein the obtaining the near field is further based on the applying of the interaction-free mask model and the applying of the thin mask model.

18. The method of claim 1, further comprising fabricating semiconductor devices based on the mask layout after the two-edge interaction model and the three-edge interaction model have been applied thereto.

19. The method of claim 16, wherein:
the applying the two-edge interaction model includes identifying different possible pairs of edges within each of the tiles; and
the applying the three-edge interaction model includes identifying different possible combinations of three edges within each of the tiles.

20. The method of claim 16, wherein each of the tiles includes a plurality of pixels, and wherein each of the pixels contains at least one of the edges.

* * * * *